United States Patent
Cho et al.

(10) Patent No.: US 11,823,904 B2
(45) Date of Patent: Nov. 21, 2023

(54) SEMICONDUCTOR DEVICE USING HARD MASK AND METHOD FOR FABRICATING THE SAME

(71) Applicant: SK hynix Inc., Gyeonggi-do (KR)

(72) Inventors: Bo Young Cho, Gyeonggi-do (KR); Jin Hee Park, Gyeonggi-do (KR); Soo Min Jo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 265 days.

(21) Appl. No.: 17/066,611

(22) Filed: Oct. 9, 2020

(65) Prior Publication Data

US 2021/0375625 A1    Dec. 2, 2021

(30) Foreign Application Priority Data

Jun. 1, 2020    (KR) .................. 10-2020-0065815

(51) Int. Cl.
     *H01L 21/31*      (2006.01)
     *H01L 21/033*     (2006.01)
     *H01L 21/311*     (2006.01)

(52) U.S. Cl.
CPC ...... *H01L 21/0332* (2013.01); *H01L 21/0337* (2013.01); *H01L 21/31144* (2013.01)

(58) Field of Classification Search
CPC ............. H01L 21/0332; H01L 21/0337; H01L 21/31144
See application file for complete search history.

(56) References Cited

U.S. PATENT DOCUMENTS

| | | | | |
|---|---|---|---|---|
| 4,656,103 A * | 4/1987 | Reichman | ................ | H01G 9/20 204/266 |
| 7,915,166 B1 * | 3/2011 | Yu | ..................... | H01L 21/76832 257/E21.171 |
| 8,846,540 B2 * | 9/2014 | Lee | ................... | H01L 21/31144 438/719 |
| 9,087,789 B2 * | 7/2015 | Cho | ..................... | H01L 21/0337 |
| 10,475,661 B2 * | 11/2019 | Seo | ........................ | H01L 21/762 |

(Continued)

FOREIGN PATENT DOCUMENTS

| | | |
|---|---|---|
| CN | 103021838 A | 4/2013 |
| CN | 107464741 A | 12/2017 |
| CN | 110957210 A | 4/2020 |

OTHER PUBLICATIONS

Office Action for the Chinese Patent Application No. 202110047687.4 issued by the Chinese Patent Office dated Aug. 22, 2023.

*Primary Examiner* — Ali Naraghi
*Assistant Examiner* — Siangluai Mang
(74) *Attorney, Agent, or Firm* — IP & T GROUP LLP

(57) ABSTRACT

The technology relates to a semiconductor device including a hard mask easy to strip and capable of implementing a fine pattern with a high etch selectivity. According to an embodiment of the disclosure, a method for fabricating a semiconductor device comprises forming an etching target layer, forming a hard mask layer on the etching target layer, the hard mask layer including a first boron-doped silicon layer and a second boron-doped silicon layer on the first boron-doped silicon layer, and etching the etching target layer using the hard mask layer as an etching barrier, wherein the second boron-doped silicon layer has a larger boron concentration than the first boron-doped silicon layer.

15 Claims, 18 Drawing Sheets

(56) References Cited

U.S. PATENT DOCUMENTS

| | | | | |
|---|---|---|---|---|
| 10,586,709 | B2* | 3/2020 | Ko | G03F 7/70033 |
| 2001/0038953 | A1* | 11/2001 | Tsukamoto | G21K 1/062 |
| | | | | 204/192.12 |
| 2004/0245583 | A1* | 12/2004 | Horiuchi | H01L 21/76895 |
| | | | | 257/E21.336 |
| 2009/0057725 | A1* | 3/2009 | Kim | H01L 27/14645 |
| | | | | 438/70 |
| 2011/0254653 | A1* | 10/2011 | Radamson | B82Y 20/00 |
| | | | | 438/54 |
| 2012/0264306 | A1* | 10/2012 | Wu | H01L 21/31144 |
| | | | | 257/E21.25 |
| 2013/0164922 | A1* | 6/2013 | Cho | H01L 21/32137 |
| | | | | 438/510 |
| 2013/0193517 | A1* | 8/2013 | Hokazono | H01L 21/823412 |
| | | | | 257/E27.06 |
| 2014/0057442 | A1* | 2/2014 | Lee | H01L 28/90 |
| | | | | 257/618 |
| 2016/0153546 | A1* | 6/2016 | Ogawa | F16H 57/0457 |
| | | | | 74/665 F |
| 2016/0163546 | A1* | 6/2016 | Godet | H01L 21/0332 |
| | | | | 257/623 |
| 2018/0076042 | A1* | 3/2018 | Cheng | C23C 16/045 |
| 2019/0172717 | A1* | 6/2019 | Ko | G03F 7/70033 |
| 2019/0187097 | A1* | 6/2019 | Li | B82B 3/0019 |
| 2019/0319150 | A1* | 10/2019 | Löper | H01L 31/1868 |
| 2020/0144104 | A1* | 5/2020 | Liu | H01L 21/76879 |
| 2020/0312853 | A1* | 10/2020 | Choi | H10B 12/30 |
| 2020/0335434 | A1* | 10/2020 | Krysak | H01L 23/528 |
| 2021/0375625 | A1* | 12/2021 | Cho | H01L 21/3081 |
| 2022/0076962 | A1* | 3/2022 | Tan | H01L 21/02274 |

\* cited by examiner

SEMICONDUCTOR DEVICE USING HARD MASK AND METHOD FOR FABRICATING THE SAME

CROSS-REFERENCE TO RELATED APPLICATIONS

The present application claims priority to Korean Patent Application No. 10-2020-0065815, filed on Jun. 1, 2020, which is herein incorporated by reference in its entirety.

BACKGROUND

1. Field

Embodiments of the disclosure relate to semiconductor devices and methods for fabricating the same and, more specifically, to semiconductor devices using hard masks and methods for fabricating the same.

2. Description of the Related Art

As semiconductor devices become more highly integrated, pattern lines also become narrower. However, using photoresist alone, patterning may be unsuccessful due to the limited resolution of exposure systems. Thus, a need arises for technology using a hard mask formed of a high-etch selectivity material.

SUMMARY

According to embodiments of the disclosure, there are provided a semiconductor device including a high-selectivity, easy-to-strip hard mask and a method for fabricating the semiconductor device.

According to an embodiment of the disclosure, a method for fabricating a semiconductor device comprises forming an etching target layer, forming a hard mask layer on the etching target layer, the hard mask layer including a first boron-doped silicon layer and a second boron-doped silicon layer on the first boron-doped silicon layer, and etching the etching target layer using the hard mask layer as an etching barrier, wherein the second boron-doped silicon layer has a larger boron concentration than the first boron-doped silicon layer.

According to an embodiment of the disclosure, a method for fabricating a semiconductor device comprises forming a mold stack layer on the substrate, forming a hard mask layer on the mold stack layer, the hard mask layer including a first boron-doped silicon layer and a second boron-doped silicon layer on the first boron-doped silicon layer, forming an opening exposing the substrate by etching the mold stack layer using the hard mask layer as an etch barrier, and forming a lower electrode in the opening, wherein the second boron-doped silicon layer has a larger boron concentration than the first boron-doped silicon layer.

According to an embodiment of the disclosure, a method for fabricating a semiconductor device comprises forming an alternate stack in which an insulation layer and a sacrificial layer are alternately stacked on a substrate, forming a hard mask layer on the alternate stack, the hard mask layer including a first boron-doped silicon layer and a second boron-doped silicon layer on the first boron-doped silicon layer, forming a stack hole exposing the substrate by etching the alternate stack using the hard mask layer as an etch barrier and forming a channel structure in the stack hole, wherein the second boron-doped silicon layer has a larger boron concentration than the first boron-doped silicon layer.

The second boron-doped silicon layer has a larger boron concentration than the first boron-doped silicon layer.

According to an embodiment of the disclosure, a semiconductor device comprises an etching target layer and a hard mask layer formed on the etching target layer, wherein the hard mask layer includes a first boron-doped silicon layer having a graded concentration of boron and a second boron-doped silicon layer having a non-graded concentration of boron.

The instant technology includes a high etch-selectivity, easy-to-strip hard mask. Thus, an etch profile may be formed vertically and, thus, processing stability and reliability may be obtained.

These and other features and advantages of the present invention will become more apparent to those with ordinary skill in the art to which the invention belongs from the following detailed description and drawings.

DETAILED DESCRIPTION

Figure 1:
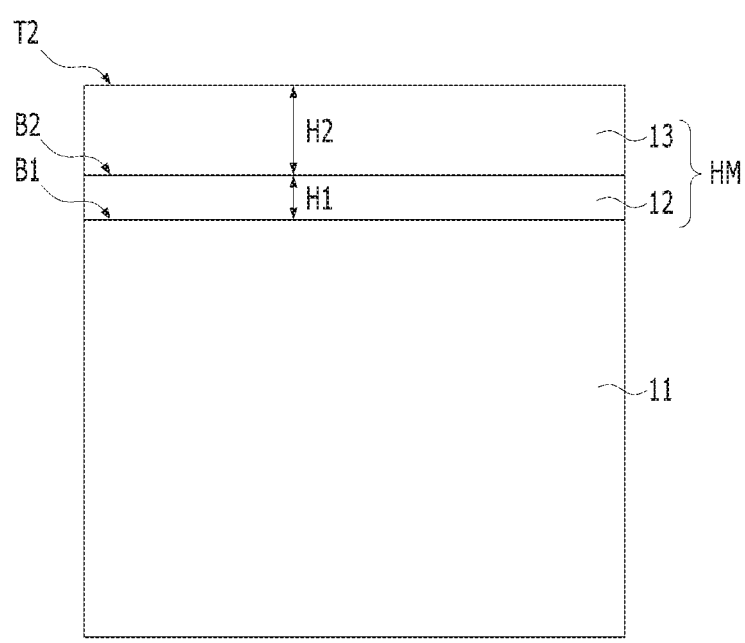
FIG. 1 is a cross-sectional view illustrating a semiconductor device according to an embodiment of the present disclosure.

Example cross-sectional views, plan views, and block diagrams may be used herein to describe embodiments of the disclosure, and modifications may be made thereto according to, e.g., manufacturing techniques and/or tolerances. Thus, embodiments of the disclosure are not limited to the specific examples as shown and illustrated herein but may encompass changes or modifications which do not depart from the scope of the invention including any changes and modifications of the described examples due to fabricating processes. It is noted that various regions or areas shown in the drawings are schematically shown, and that their shapes as shown are provided merely as examples, rather than as limiting the scope of the invention. It is also noted that elements shown in the drawings may be exaggerated in light of their thicknesses and intervals for illustration purposes. Well known components or elements irrelevant to the subject matter of the disclosure may be omitted from the description. The same or substantially the same reference denotations are used to refer to the same or substantially the same elements throughout the specification and the drawings.

Hereinafter, embodiments of the disclosure are described in detail with reference to the accompanying drawings. For ease of description, the description focuses primarily on dynamic random-access memory (DRAM), but the inventive concept is not limited thereto but may be applicable to other memory or semiconductor devices.

FIG. 1 is a cross-sectional view illustrating a semiconductor device according to an embodiment of the present disclosure.

Figure 2A:
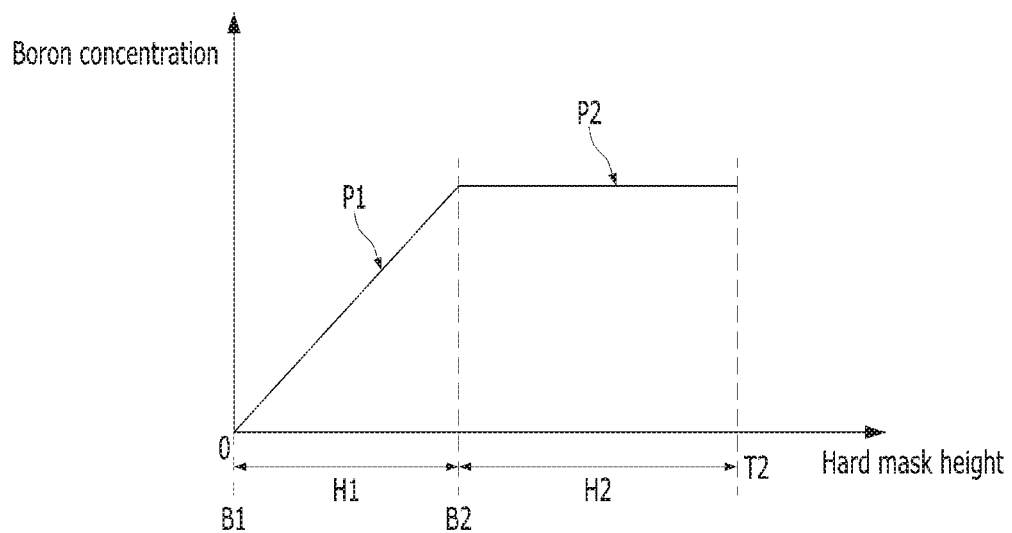
FIGS. 2A and 2B are graphs illustrating a boron doping concentration according to an embodiment of the present disclosure.
Figure 2B:
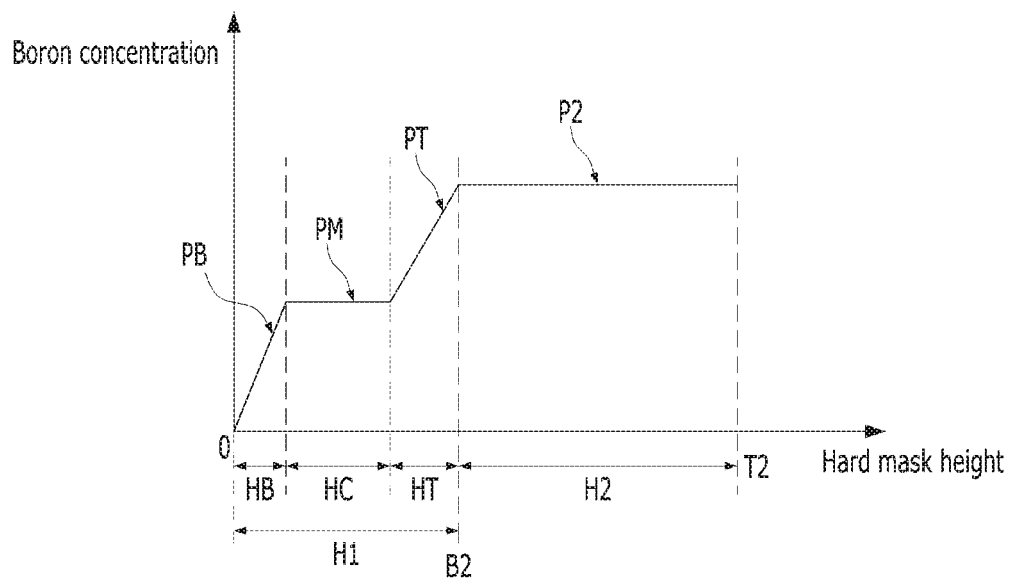

FIGS. 2A and 2B are views illustrating differences in boron concentration depending on hard mask levels according to an embodiment of the present disclosure.

Referring to FIG. 1, an etching target layer 11 may be provided. The etching target layer 11 may be a single layer. Alternatively, the etching target layer 11 may be a multi-layer structure having at least two or more layers. The etching target layer 11 may be any suitable semiconductor substrate. For example, the etching target layer 11 may be a silicon substrate. The etching target layer 11 may be or include an undoped silicon (Si) or an amorphous silicon layer. The etching target layer 11 may be or include an oxide, a nitride, an oxynitride, or a combination thereof. The etching target layer 11 may be or include an insulation material. The etching target layer 11 may be or include a silicon oxide. The etching target layer 11 may be or include a borosilicate glass (BSG), phosphosilicate glass (PSG), borophosphosilicate glass (BPSG), or tetra ethyl ortho silicate (TEAS). The etching target layer 11 may be or include a stack of silicon oxide and silicon nitride. The etching target layer 11 may be or include an alternate stack of a plurality of silicon oxide layers and a plurality of silicon nitride layers alternately stacked.

A hard mask layer HM may be formed on the etching target layer 11. The hard mask layer HM may be formed to be in direct contact with the etching target layer 11. The hard mask layer HM may be formed to define at least one or more openings (not shown) in the etching target layer 11. The at least one or more openings may include a contact hole, recess, trench, gap, or a combination thereof. The hard mask layer HM may have a multi-layer structure. According to the embodiment illustrated in FIG. 1, the hard mask layer HM may have a dual-layer structure. The hard mask layer HM may include a first doped silicon layer 12 and a second doped silicon layer 13. The dopant in the first and second doped silicon layers may be boron. The first doped silicon layer 12 and the second doped silicon layer 13 may include two independent hard mask layers. the first doped silicon layer 12 and the second doped silicon layer 13 may be ones into which one hard mask layer HM is divided depending on the concentration gradient of boron. For example, the hard mask layer HM may include a single doped silicon layer which may have a dopant (e.g., boron) concentration gradient along its thickness direction. The thickness direction may be the stacking direction.

The hard mask layer HM may be formed, for example, of any one of polysilicon, an oxide film, a nitride film, or a combination thereof. According to an embodiment, the hard mask layer HM may be formed of polysilicon. The hard mask layer HM may be doped with a dopant. The dopant may be, for example, boron. The etch selectivity for the etching target layer 11 of the hard mask layer HM may increase as the concentration of the dopant increases. The hard mask layer HM may be a boron-doped layer. According to an embodiment, the hard mask layer HM may be a boron-doped silicon (Si) layer formed by doping a polysilicon layer with boron. The hard mask layer HM may be formed using, for example, a $B_2H_6$ gas and a $SiH_4$ gas. The hard mask layer HM may include, in a variation of this embodiment, an additional dopant. The additional dopant may be, for example, at least one selected from among tungsten (W), carbon (C), nitrogen (N), or a combination thereof. For example, the hard mask layer HM may be a silicon layer doped with tungsten and boron. The hard mask layer HM may be a silicon layer doped with carbon and boron, according to an embodiment. The hard mask layer HM may be a silicon layer doped with tungsten, carbon and boron, according to an embodiment.

The first doped silicon layer 12 may be or include a low-concentration boron-doped silicon layer, and the second doped silicon layer 13 may be or include a high-concentration boron-doped silicon layer. The first doped silicon layer 12 may have a first boron concentration at which stripping proceeds more rapidly than the second doped silicon layer 13. The second doped silicon layer 13 may have a second boron concentration at which the etch selectivity for the etching target layer 11 is rendered larger than the first doped silicon layer 12. Any one of the first doped silicon layer 12 and the second doped silicon layer 13 may further include, in a variation of this embodiment, an additional dopant. The additional dopant may be, for example, at least one selected from among tungsten, carbon, nitrogen, or a combination thereof. For example, any one of the first doped silicon layer 12 or the second doped silicon layer 13 may be or include a silicon layer doped with tungsten and boron. Alternatively, any one of the first doped silicon layer 12 or the second doped silicon layer 13 may be or include a silicon layer doped with carbon and boron, according to an embodiment. Any one of the first doped silicon layer 12 or the second doped silicon layer 13 may be or include a silicon layer doped with tungsten, carbon and boron, according to an embodiment.

The hard mask layer HM may be formed, for example, by chemical vapor deposition (CVD), physical vapor deposition (PVD), or atomic layer deposition (ALD). To increase the deposition effect, the hard mask layer HM may use a plasma. For example, the hard mask layer HM may be formed by, e.g., plasma enhanced CVD (PECVD) or plasma enhanced ALD (PEALD). According to an embodiment, the hard mask layer HM may be formed, via PECVD, using a $SiH_4$ gas and a $B_2H_6$ gas.

The first doped silicon layer 12 may be formed on the etching target layer 11. The first doped silicon layer 12 may be formed to be in direct contact with the etching target layer 11. The first doped silicon layer 12 may include a bottom surface B1 and a top surface B2. The boron concentration at the bottom surface B1 of the first doped silicon layer 12 may differ from the boron concentration at the top surface B2 of the first doped silicon layer 12.

An example of the boron concentration of the first doped silicon layer 12 is shown in FIG. 2A. The first doped silicon layer 12 may include a graded concentration of boron. The first doped silicon layer 12 may include a graded vertical concentration of boron. The boron concentration of the first doped silicon layer 12 may be lowest at the bottom surface B1 of the first doped silicon layer 12 and may have a gradient doping profile in which the boron concentration of the first doped silicon layer 12 gradually increases away from the bottom surface B1 of the first doped silicon layer 12. It is noted that FIG. 2A is a schematic simplified view, and that the ratio P1 of boron concentration to the vertical distance from the bottom surface B1 of the first doped silicon layer 12 is not limited to that shown but may be altered in various slopes.

Another example of a boron concentration of the first doped silicon layer 12 is shown in FIG. 26. According to FIG. 26, the first doped silicon layer 12 may include a multi-layer stack of boron-doped silicon layers. The boron concentration of the first doped silicon layer 12 may include a gradient doping profile in which the boron concentration of the first doped silicon layer 12 gradually increases from the lowest-level boron-doped silicon layer to the highest-level boron-doped silicon layer. According to an embodiment, the first doped silicon layer 12 may be a multi-layer stack including a bottom layer, which is at the lowest level, an intermediate layer, which is at an intermediate level higher than the bottom layer, and a top layer, which is at the highest level higher than the intermediate layer. The boron concentration of the first doped silicon layer 12 may include a gradient doping profile in which the boron concentration of the first doped silicon layer 12 gradually increases from the bottom to top layer. The ratio PB of boron concentration to the height HB of the bottom layer may be identical to or different from the ratio PM of boron concentration to the height HC of the intermediate layer and the ratio PT of boron concentration to the height HT of the top layer. For example, the ratio PB of boron concentration to the height HB of the bottom layer may be larger than the ratio PM of boron concentration to the height HC of the intermediate layer and the ratio PT of boron concentration to the height HT of the top layer. The ratio PM of boron concentration to the height HC of the intermediate layer may be smaller than the ratio PB of boron concentration to the height HB of the bottom layer and the ratio PT of boron concentration to the height HT of the top layer. The height HB of the bottom layer, the height HC of the intermediate layer, and the height HT of the top layer may be identical to or different from each other. For example, the height HB of the bottom layer may be smaller than the height HC of the intermediate layer and the height HT of the top layer. The height HC of the intermediate layer may be larger than the height HB of the bottom layer and the height HT of the top layer. It is noted that FIG. 2B is a simplified schematic example and the ratio PB of boron concentration to the height HB of the bottom layer of the first doped silicon layer 12, the ratio PM of boron concentration to the height HC of the intermediate layer, and the ratio PT of boron concentration to the height HT of the top layer are not limited to those shown therein but may rather include various values. The height HB of the bottom layer of the first doped silicon layer 12, the height HC of the intermediate layer, and the height HT of the top layer are not limited to those shown in the drawings but may include various values.

The first doped silicon layer 12 may further include at least one additional dopant selected, for example, from among tungsten, carbon, nitrogen, or a combination thereof. Thus, the first doped silicon layer 12 may be a silicon layer doped with tungsten and boron. The first doped silicon layer 12 may be a silicon layer doped with carbon and boron, according to an embodiment. The first doped silicon layer 12 may be a silicon layer doped with tungsten, carbon and boron, according to an embodiment.

The second doped silicon layer 13 may be formed on the first doped silicon layer 12. The second doped silicon layer 13 may be formed to directly contact the first doped silicon layer 12. The thickness H2 of the second doped silicon layer 13 may be larger than the thickness H1 of the first doped silicon layer 12. The second doped silicon layer 13 may include a single boron-doped silicon layer. The thickness H2 of the single boron-doped silicon layer of the second doped silicon layer 13 may be larger than the thickness H1 of the multi-layer stack of boron-doped silicon layers of the first doped silicon layer 12. The second doped silicon layer 13 may include a bottom surface 62 and a top surface T2. The bottom surface B2 of the second doped silicon layer 13 may denote the same surface as the top surface 62 of the first doped silicon layer 12. The bottom surface B2 of the second doped silicon layer 13 may have the same boron concentration as the top surface T2.

The boron concentration of the second doped silicon layer 13 may be larger than the boron concentration of the first doped silicon layer 12. The second doped silicon layer 13 may have a non-graded concentration of boron. The second doped silicon layer 13 may include a non-graded vertical concentration of boron. The boron concentration of the second doped silicon layer 13 may have a profile in which the boron concentration of the second doped silicon layer 13 is uniform from the bottom surface 62 of the second doped silicon layer 13 to the top surface T2. Referring to FIG. 2A, the ratio P2 of boron concentration to the vertical distance H2 from the bottom surface 62 of the second doped silicon layer 13 may be constant. The boron concentration of the second doped silicon layer 13 may be continuous from the boron concentration of the first doped silicon layer 12. Thus, the boron concentration at the bottom surface B2 of the second doped silicon layer 13 may be identical to the boron concentration at the highest level of the first doped silicon layer 12.

The second doped silicon layer 13 may further include at least one additional dopant selected, for example, from among tungsten, carbon, nitrogen, or a combination thereof. Thus, the second doped silicon layer 13 may be a silicon layer doped with tungsten and boron. The second doped silicon layer 13 may be a silicon layer doped with carbon and boron, according to an embodiment. The second doped silicon layer 13 may be a silicon layer doped with tungsten, carbon and boron, according to an embodiment.

In the instant embodiment, the second doped silicon layer may be evenly doped with a high-concentration of boron, increasing the etch selectivity for the etching target layer 11. Further, since the boron concentration gradually increases as the distance from the bottom surface B1 of the first doped silicon layer 12 increases, hard mask stripping may be easily performed. In other words, a high-etch selectivity, easy-to-strip hard mask layer HM may be formed by forming the second doped silicon layer 13 and the first doped silicon layer 12. Thus, the etch profile of the etching target layer 11 may be vertically formed. As the etch file is vertically formed, the processing stability and reliability may be secured for semiconductor devices.

FIGS. 3A to 3E are cross-sectional views illustrating a method for fabricating a semiconductor device according to an embodiment of the present invention. According to an embodiment, a semiconductor device may include a semiconductor element with a contact plug.

Figure 3A:
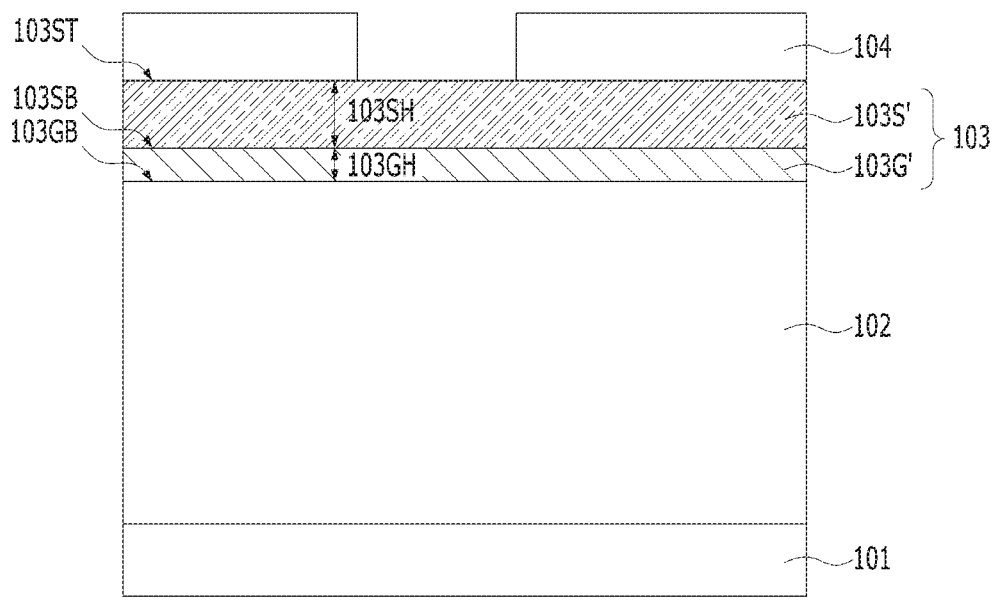
FIGS. 3A, 3B, 3C, 3D, and 3E are views illustrating a method of manufacturing a semiconductor device according to an embodiment of the present disclosure.

Referring to FIG. 3A, a substrate 101 may be prepared. The substrate 101 may be made of or include any material suitable for semiconductor processing. The substrate 101 may include a semiconductor substrate. The substrate 101 may be formed, for example, of a silicon-containing material. The substrate 101 may be or include silicon, monocrystalline silicon, polysilicon, amorphous silicon, silicon-germanium, monocrystalline silicon-germanium, polycrystalline silicon-germanium, carbon-doped silicon, a combination thereof, and may be a single layer or a multi-layer structure thereof. The substrate 101 may be or include other semiconductor material, e.g., germanium. The substrate 101 may be or include a compound semiconductor substrate, e.g., a group-IIIV semiconductor substrate, such as of GaAs. The substrate 101 may be or include a silicon-on-insulator (SOI) substrate.

An inter-layer insulation layer 102 may be formed on the substrate 101. The inter-layer insulation layer 102 may be formed to directly contact the substrate 101. The inter-layer insulation layer 102 may be or include an insulation material. The inter-layer insulation layer 102 may be or include a silicon oxide, a silicon nitride, a low-k material, or a combination thereof. The inter-layer insulation layer 102 may be or include a spin-on-dielectrics (SOD) material.

A hard mask layer 103 may be formed on the inter-layer insulation layer 102, The hard mask layer 103 may be formed to directly contact the inter-layer insulation layer 102. The hard mask layer 103 may be formed to define at least one or more openings in the inter-layer insulation layer 102. The hard mask layer 103 may have a multi-layer structure. According to an embodiment, the hard mask layer 103 may have a dual-layer structure. The hard mask layer 103 may include a first doped silicon layer 103G' and a second doped silicon layer 103S'. According to an embodiment, the first doped silicon layer 103G' and the second doped silicon layer 103S' may be defined in a single hard mask layer 103 by their different doping concentration. Alternatively, the first and second doped silicon layers 103G' and 103S' may be two independent hard mask layers, i.e., two hard mask layers which are formed separately and then doped with different amounts of boron.

The hard mask layer 103 may be formed, for example, of any one of polysilicon, an oxide film, a nitride film, or a combination thereof. According to an embodiment, the hard mask layer 103 may be formed of polysilicon. The hard mask layer 103 may be doped with a dopant. The etch selectivity for the inter-layer insulation layer 102 of the hard mask layer 103 may increase as the concentration of the dopant increases. The hard mask layer 103 may be a boron-doped layer. According to an embodiment, the hard mask layer 103 may be a boron-doped silicon (Si) layer formed by doping a polysilicon layer with boron. The hard mask layer 103 may be formed using, for example, a $B_2H_6$ gas and a $SiH_4$ gas. The hard mask layer 103 may further include, in a variation of this embodiment, an additional dopant. The additional dopant may be, for example, at least any one selected from among tungsten (W), carbon (C), nitrogen (N), or a combination thereof. For example, the hard mask layer 103 may be a silicon layer doped with tungsten and boron. The hard mask layer 103 may be a silicon layer doped with carbon and boron, according to an embodiment. The hard mask layer 103 may be a silicon layer doped with tungsten, carbon and boron, according to an embodiment.

The first doped silicon layer 103G' may be or include a low-concentration boron-doped silicon layer, and the second doped silicon layer 103S' may be or include a high-concentration boron-doped silicon layer. The first doped silicon layer 103G' may have a first boron concentration at which stripping proceeds more rapidly than the second doped silicon layer 103S'. The second doped silicon layer 103S' may have a second boron concentration at which the etch selectivity for the inter-layer insulation layer 102 is rendered larger than the first doped silicon layer 103G'. Any one of the first doped silicon layer 103G' and the second doped silicon layer 103S' may further include, in a variation of this embodiment, an additional dopant. The additional dopant may be, for example, at least any one selected from among tungsten, carbon, nitrogen, or a combination thereof. For example, any one of the first doped silicon layer 103G' or the second doped silicon layer 103S' may be or include a silicon layer doped with tungsten and boron. Alternatively, any one of the first doped silicon layer 103G' or the second doped silicon layer 103S' may be or include a silicon layer doped with carbon and boron, according to an embodiment. Any one of the first doped silicon layer 103G' or the second doped silicon layer 103S' may be or include a silicon layer doped with tungsten, carbon and boron, according to an embodiment.

The hard mask layer 103 may be formed, for example, by chemical vapor deposition (CVD), physical vapor deposition (PVD), or atomic layer deposition (ALD). To increase the deposition effect, the hard mask layer 103 may use a plasma. For example, the hard mask layer 103 may be formed by, e.g., plasma enhanced CVD (PECVD) or plasma enhanced ALD (PEALD). According to an embodiment, the hard mask layer 103 may be formed, via PECVD, using a $SiH_4$ gas and a $B_2H_6$ gas.

The first doped silicon layer 103G' may be formed on the inter-layer insulation layer 102. The first doped silicon layer 103G' may include a bottom surface 103GB and a top surface 103SB. The boron concentration at the bottom surface 103GB of the first doped silicon layer 103G' may differ from the boron concentration at the top surface 103SB of the first doped silicon layer 103G'.

The boron concentration of the first doped silicon layer 103G' is shown in FIG. 2A. The first doped silicon layer 103G' may include a graded concentration of boron. The first doped silicon layer 103G' may include a graded vertical concentration of boron. The boron concentration of the first doped silicon layer 103G' may be lowest at the bottom surface 103GB of the first doped silicon layer 103G' and may have a gradient doping profile in which the boron concentration of the first doped silicon layer 103G' gradually increases away from the bottom surface 103GB of the first doped silicon layer 103G'. FIG. 2A is a schematic simplified view, and the ratio P1 of boron concentration to the vertical distance from the bottom surface 103GB of the first doped silicon layer 103G' is not limited to that shown but may be altered in various slopes.

The boron concentration of the first doped silicon layer 103G' is shown in FIG. 2B. The first doped silicon layer 103G' may include a multi-layer stack of boron-doped silicon layers. The boron concentration of the first doped silicon layer 103G' may include a gradient doping profile in which the boron concentration of the first doped silicon layer 103G' gradually increases from the lowest-level boron-doped silicon layer to the highest-level boron-doped silicon layer. According to an embodiment, the first doped silicon layer 103G' may be a multi-layer stack including a bottom layer, which is at the lowest level, an intermediate layer, which is at an intermediate level higher than the bottom layer, and a top layer, which is at the highest level higher than the intermediate layer. The boron concentration of the first doped silicon layer 103G' may include a gradient doping profile in which the boron concentration of the first doped silicon layer 12 gradually increases from the bottom to top layer. The ratio PB of boron concentration to the height HB of the bottom layer may be identical to or different from the ratio PM of boron concentration to the height HC of the intermediate layer and the ratio PT of boron concentration to the height HT of the top layer. For example, the ratio PB of boron concentration to the height HB of the bottom layer may be larger than the ratio PM of boron concentration to the height HC of the intermediate layer and the ratio PT of boron concentration to the height HT of the top layer. The ratio PM of boron concentration to the height HC of the intermediate layer may be smaller than the ratio PB of boron concentration to the height HB of the bottom layer and the ratio PT of boron concentration to the height HT of the top layer. The height HB of the bottom layer, the height HC of the intermediate layer, and the height HT of the top layer may be identical to or different from each other. For example, the height HB of the bottom layer may be smaller than the height HC of the intermediate layer and the height HT of the top layer. The height HC of the intermediate layer may be larger than the height HB of the bottom layer and the height HT of the top layer. It is noted that FIG. 2B is a simplified schematic example and the ratio PB of boron concentration to the height HB of the bottom layer of the first doped silicon layer 103G', the ratio PM of boron concentration to the height HC of the intermediate layer, and the ratio PT of boron concentration to the height HT of the top layer are not limited to those shown therein but may include various values. The height HB of the bottom layer of the first doped silicon layer 103G', the height HC of the intermediate layer, and the height HT of the top layer are not limited to those shown in the drawings but may include various values.

The first doped silicon layer 103G' may further include at least one additional dopant selected from among tungsten, carbon, nitrogen, or a combination thereof. Thus, the first doped silicon layer 103G' may be a silicon layer doped with tungsten and boron. The first doped silicon layer 103G' may be a silicon layer doped with carbon and boron, according to an embodiment. The first doped silicon layer 103G' may be a silicon layer doped with tungsten, carbon and boron, according to an embodiment.

The second doped silicon layer 103S' may be formed on and may directly contact the first doped silicon layer 103G'. The thickness 103SH of the second doped silicon layer 103S' may be larger than the thickness 103GH of the first doped silicon layer 103G. The second doped silicon layer 103S' may include a single boron-doped silicon layer. The thickness 103SH of the single boron-doped silicon layer of the second doped silicon layer 103S' may be larger than the thickness 103GH of the multi-layer stack of boron-doped silicon layers of the first doped silicon layer 103G'. The second doped silicon layer 103S' may include a bottom surface 103SB and a top surface 103ST, and the bottom surface 103SB of the second doped silicon layer 103S' may denote the same surface as the top surface 103SB of the first doped silicon layer 103G'. The bottom surface 103SB of the second doped silicon layer 103S' may have the same boron concentration as the top surface 103ST.

The boron concentration of the second doped silicon layer 103S' may be larger than the boron concentration of the first doped silicon layer 103G'. The second doped silicon layer 103S' may have a non-graded concentration of boron. The second doped silicon layer 103S' may include a non-graded vertical concentration of boron. The boron concentration of the second doped silicon layer 103S' may have a profile in which the boron concentration of the second doped silicon layer 103S' is uniform from the bottom surface 103SB of the second doped silicon layer 103S' to the top surface 103ST. Referring to FIG. 2A, the ratio P2 of boron concentration to the vertical distance 103SH from the bottom surface 103SB of the second doped silicon layer 103S' may be constant. The boron concentration of the second doped silicon layer 103S' may be continuous from the boron concentration of the first doped silicon layer 103G'. Thus, the boron concentration at the bottom surface 103SB of the second doped silicon layer 103S' may be identical to the boron concentration at the highest level of the first doped silicon layer 103G'.

The second doped silicon layer 103S' may further include at least one additional dopant selected from among tungsten, carbon, nitrogen, or a combination thereof. Thus, the second doped silicon layer 103S' may be a silicon layer doped with tungsten and boron. The second doped silicon layer 103S' may be a silicon layer doped with carbon and boron, according to an embodiment. The second doped silicon layer 103S' may be a silicon layer doped with tungsten, carbon and boron, according to an embodiment.

A contact mask 104 may be formed on the second doped silicon layer 103S' and may directly contact the second doped silicon layer 103S'. The contact mask 104 may include a photoresist pattern.

Figure 3B:
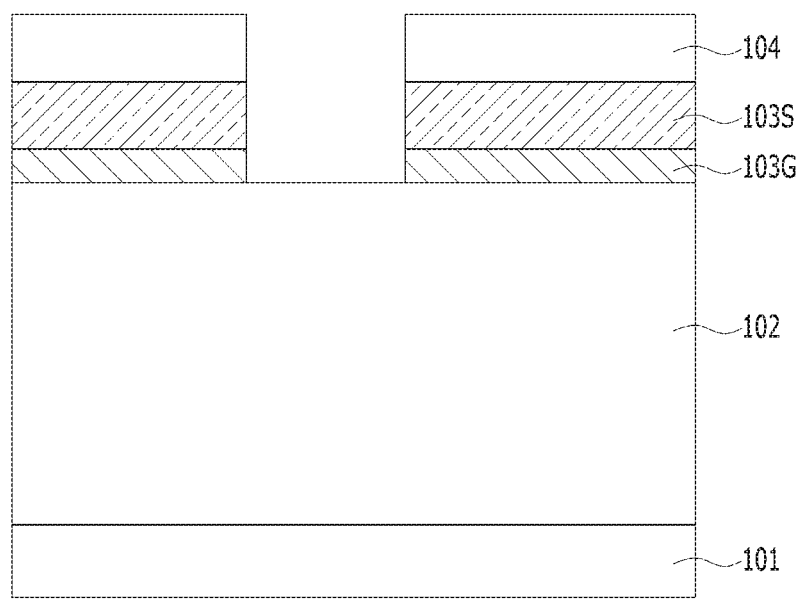

As illustrated in FIG. 3B, the contact mask 104 may be used as an etch mask to selectively remove the second doped silicon layer 103S' and the first doped silicon layer 103G'. Thus, the second doped silicon layer 103S' may become a second boron-doped silicon pattern 103S. The first doped silicon layer 103G' may become a first boron-doped silicon pattern 103G. By the etching process, a portion of the inter-layer insulation layer 102 may be exposed.

Figure 3C:
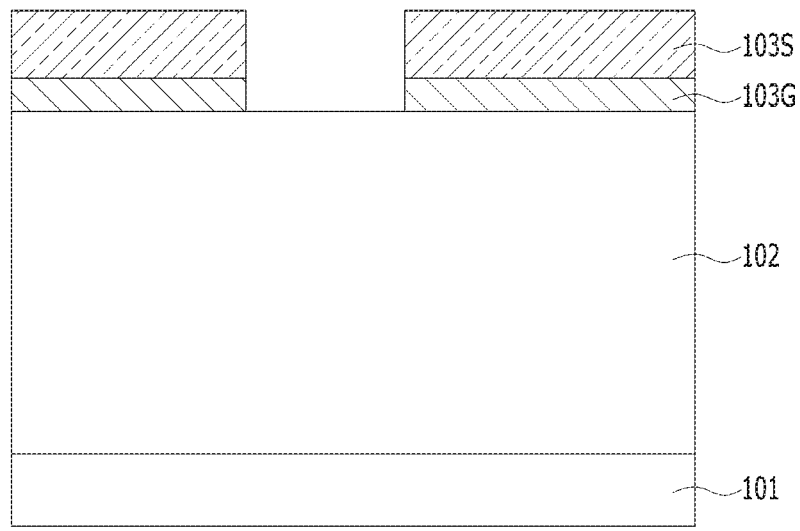

As illustrated in FIG. 3C, the contact mask 104 may be removed. While removing the contact mask 104, the second boron-doped silicon pattern 103S may be thinned. In other words, the thickness of the second boron-doped silicon pattern 103S after the contact mask 104 is removed may be smaller than the thickness of the second boron-doped silicon pattern 103S before the contact mask 104 is removed.

Figure 3D:
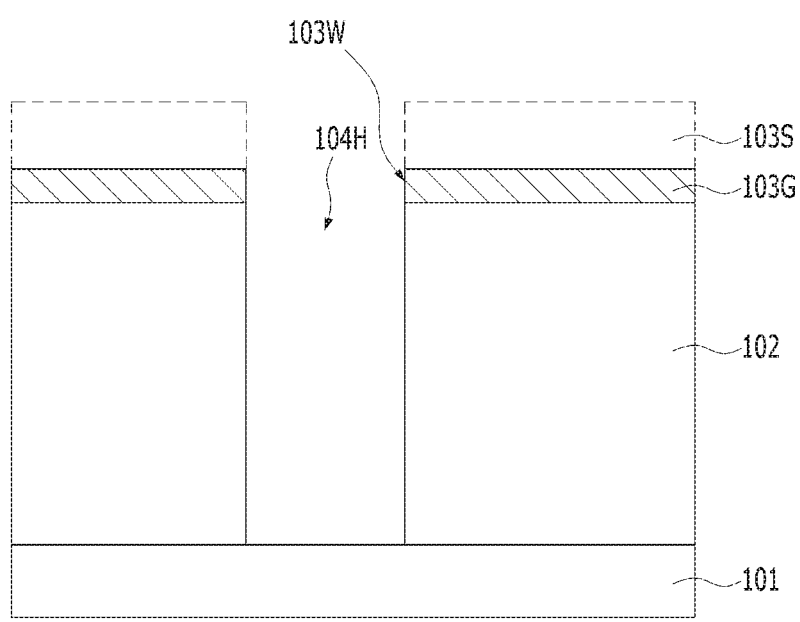

As illustrated in FIG. 3D, a contact hole 104H may be formed in the inter-layer insulation layer 102. To form the contact hole 104H, the second boron-doped silicon pattern 103S and the first boron-doped silicon pattern 103G may be used as an etch mask. While forming the contact hole 104H, the second boron-doped silicon pattern 103S may be removed. The thickness of the first boron-doped silicon pattern 103G after the contact hole 104H is formed may be smaller than the thickness of the first boron-doped silicon pattern 103G before the contact hole 104H is formed.

By the above-described etching process, a plurality of contact holes 104H may be formed. Various contact holes 104H may be formed depending on the difficulty of etching process. For example, as the boron concentration of the first doped silicon layer 103G' reduces, stripping of the first doped silicon layer 103G' may be easier. Thus, a side wall 103W of the first boron-doped silicon pattern 103G may be vertically formed. As the side wall 103W of the first boron-doped silicon pattern 103G is vertically formed, a side wall of the contact hole 104H may be vertically formed. As the side wall of the contact hole 104H is vertically formed, a bad contact of the contact plug may be prevented, and voids may be enhanced. To form the contact hole 104H, dry etching, wet etching, or a combination thereof may be used. The contact hole 104H may have a high aspect ratio. The contact hole 104H may have an aspect ratio of, at least, 1:1 or more.

Figure 3E:
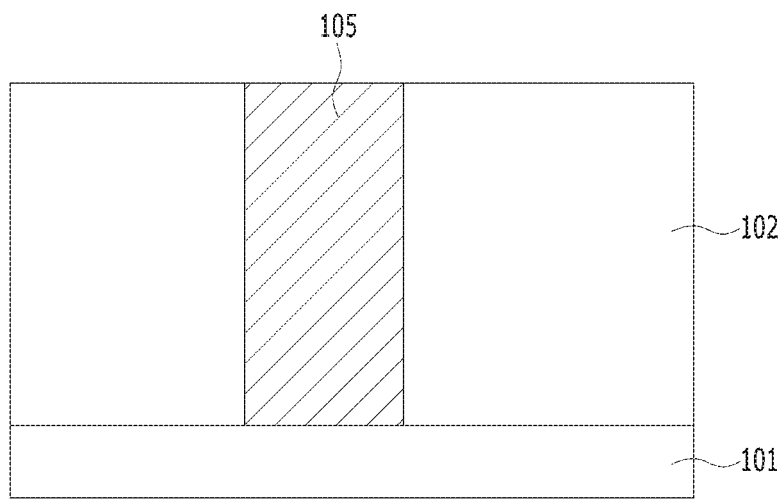

As illustrated in FIG. 3E, the first boron-doped silicon pattern 103G may be removed. Subsequently, a contact plug layer (not shown) may be formed to cover the contact hole 104H and the inter-layer insulation layer 102. The contact plug layer (not shown) may be polished until the top surface of the inter-layer insulation layer 102 is exposed, thereby forming a contact plug 105 in the contact hole 104H.

In the instant embodiment, the second doped silicon layer 103S' may be evenly doped with a high-concentration of boron, increasing the etch selectivity for the inter-layer insulation layer 102. Further, since the boron concentration gradually increases as the distance from the bottom surface 103GB of the first doped silicon layer 103G' increases, hard mask stripping may be easily performed. In other words, a high-etch selectivity, easy-to-strip hard mask layer may be formed by forming the second doped silicon layer 103S' and the first doped silicon layer 103G'. Thus, the etch profile of the inter-layer insulation layer 102 may be vertically formed. As the etch file is vertically formed, the processing stability and reliability may be secured for semiconductor devices.

FIGS. 4A to 4G are cross-sectional views illustrating a method for fabricating a semiconductor device according to an embodiment of the present invention. According to an embodiment, a semiconductor device may include a semiconductor element with a capacitor.

Figure 4A:
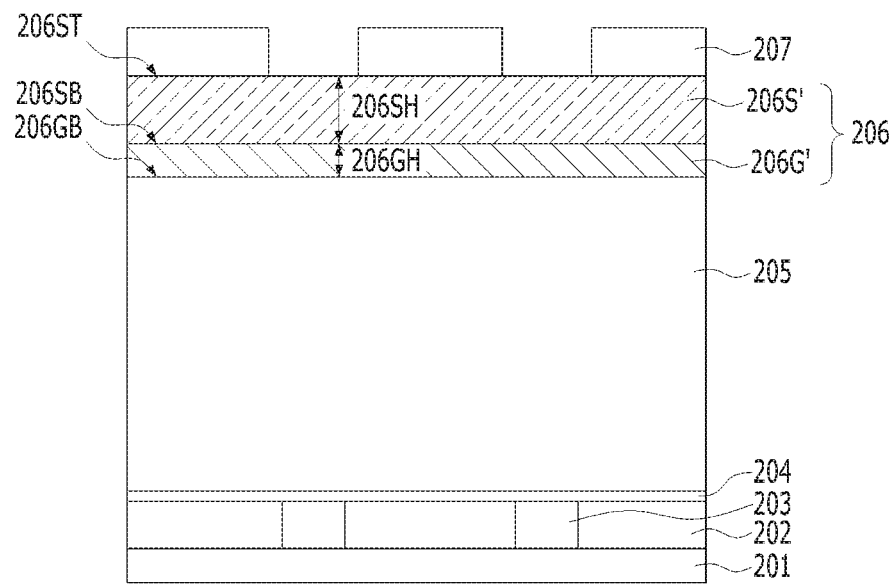
FIGS. 4A, 4B, 4C, 4D, 4E, 4F, and 4G are views illustrating a method of manufacturing semiconductor device according to an embodiment of the present disclosure.

Referring to FIG. 4A, an inter-layer insulation layer 202 may be formed on a substrate 201. A contact plug 203 may be formed through the inter-layer insulation layer 202. The contact plug 203 may pass through the inter-layer insulation layer 202 and connect to the substrate 201. Although not shown, before the contact plug 203 is formed, a cell transistor, bit line contact plug, and bit line may further be formed.

The substrate 201 may include any material suitable for semiconductor processing. The substrate 201 may include a semiconductor substrate. The substrate 201 may be formed, for example, of a silicon-containing material. The substrate 201 may be or include silicon, monocrystalline silicon, polysilicon, amorphous silicon, silicon-germanium, monocrystalline silicon-germanium, polycrystalline silicon-germanium, carbon-doped silicon, a combination thereof, and may be a single layer or a multi-layer structure thereof. The substrate 201 may be or include other semiconductor material, e.g., germanium. The substrate 201 may be or include a compound semiconductor substrate, e.g., a group-IT-TV semiconductor substrate, such as of GaAs. The substrate 201 may be or include a silicon-on-insulator (SOI) substrate.

The inter-layer insulation layer 202 may be or include a silicon oxide, a silicon nitride, or a combination thereof. The inter-layer insulation layer 202 may be or include a borosilicate glass (BSG), phosphosilicate glass (PSG), borophosphosilicate glass (BPSG), tetra ethyl ortho silicate (TEOS), undoped silicate glass (USG), or spin-on-glass (SOG).

To form the contact plug 203, the inter-layer insulation layer 202 may be etched to form a contact hole (the reference denotation omitted), and the contact hole may be filled with a conductive material. The contact plug 203 may include polysilicon, metal, metal nitride, metal silicide, or a combination thereof. For example, for the contact plug 203, polysilicon, metal silicide, and a metal may be stacked in the order thereof.

An etch stop layer 204 may be formed on the contact plug 203 and the inter-layer insulation layer 202. The etch stop layer 204 may be formed of a material with etch selectivity for a mold layer 205. The etch stop layer 204 may be or include a silicon nitride. The etch stop layer 204 may be used as an etch endpoint upon etching the mold layer 205. The etch stop layer 204 may be formed, for example, by chemical vapor deposition (CVD), physical vapor deposition (PVD), or atomic layer deposition (ALD). To increase the deposition effect, the etch stop layer 204 may use a plasma. In other words, the etch stop layer 204 may be formed by, e.g., PECVD or PEALD.

The mold layer 205 may be formed on the etch stop layer 204. The mold layer 205 may be or include an insulation material. The mold layer 205 may be or include a borosilicate glass (BSG), phosphosilicate glass (PSG), borophosphosilicate glass (BPSG), or tetra ethyl ortho silicate (TEOS). The mold layer 205 may be a single layer. Alternatively, the mold layer 205 may have a multi-layer structure with at least two or more layers. For example, a BPSG layer and a TEOS layer may be stacked. In another embodiment, the mold layer 205 may be or include an undoped silicon layer or an amorphous silicon layer.

A hard mask layer 206 may be formed on the mold layer 205. The hard mask layer 206 may be formed to define at least one or more openings in the mold layer 205. The hard mask layer 206 may have a multi-layer structure. According to an embodiment, the hard mask layer 206 may have a dual-layer structure. The hard mask layer 206 may include a first doped silicon layer 206G' and a second doped silicon layer 206S'. The dopant in the first and second doped silicon layers may be boron. According to an embodiment, although the first doped silicon layer 206G' and the second doped silicon layer 206S' are separated from each other to describe the hard mask layer 206, the first doped silicon layer 206G' and the second doped silicon layer 206S' may be ones into which one hard mask layer 206 is divided depending on the concentration gradient of boron. Alternatively, the first doped silicon layer 206G' and the second doped silicon layer 206S' may include two independent hard mask layers.

The hard mask layer 206 may be formed, for example, of any one of polysilicon, an oxide film, a nitride film, or a combination thereof. According to an embodiment, the hard mask layer 206 may be formed of polysilicon. The hard mask layer 206 may be doped with a dopant. The etch selectivity for the mold layer 205 of the hard mask layer 206 may increase as the concentration of the dopant increases. The hard mask layer 206 may be a boron-doped layer. According to an embodiment, the hard mask layer 206 may be a boron-doped silicon (Si) layer formed by doping a polysilicon layer with boron. The hard mask layer 206 may be formed using, for example, a $B_2H_6$ gas and a $SiH_4$ gas. The hard mask layer 206 may further include, in a variation of this embodiment, an additional dopant. The additional dopant may be, for example, at least any one selected from among tungsten (W), carbon (C), nitrogen (N), or a combination thereof. For example, the hard mask layer 206 may be a silicon layer doped with tungsten and boron. The hard mask layer 206 may be a silicon layer doped with carbon and boron, according to an embodiment. The hard mask layer 206 may be a silicon layer doped with tungsten, carbon and boron, according to an embodiment.

The first doped silicon layer 206G' may be or include a low-concentration boron-doped silicon layer, and the second doped silicon layer 206S' may be or include a high-concentration boron-doped silicon layer. The first doped silicon layer 206G' may have a first boron concentration at which stripping proceeds more rapidly than the second doped silicon layer 206S'. The second doped silicon layer 206S' may have a second boron concentration at which the etch selectivity for the mold layer 205 is rendered larger than the first doped silicon layer 206G'. Any one of the first doped silicon layer 206G' and the second doped silicon layer 206S' may further include, in a variation of this embodiment, an additional dopant. The additional dopant may be, for example, at least any one selected from among tungsten, carbon, nitrogen, or a combination thereof. For example, any one of the first doped silicon layer 206G' or the second doped silicon layer 206S' may be or include a silicon layer doped with tungsten and boron. Alternatively, any one of the first doped silicon layer 206G' or the second doped silicon layer 206S' may be or include a silicon layer doped with carbon and boron, according to an embodiment. Any one of the first doped silicon layer 206G' or the second doped silicon layer 206S' may be or include a silicon layer doped with tungsten, carbon and boron, according to an embodiment.

The hard mask layer 206 may be formed, for example, by chemical vapor deposition (CVD), physical vapor deposition (PVD), or atomic layer deposition (ALD). To increase the deposition effect, the hard mask layer 206 may use a plasma. For example, the hard mask layer 206 may be formed by, e.g., plasma enhanced CVD (PECVD) or plasma enhanced ALD (PEALD). According to an embodiment, the hard mask layer 206 may be formed, via PECVD, using a SiH$_4$ gas and a B$_2$H$_6$ gas.

The first doped silicon layer 206G' may be formed on the mold layer 205. The first doped silicon layer 206G' may include a bottom surface 206GB and a top surface 206SB. The boron concentration at the bottom surface 206GB of the first doped silicon layer 206G' may differ from the boron concentration at the top surface 206SB of the first doped silicon layer 206G'.

The boron concentration of the first doped silicon layer 206G' is shown in FIG. 2A. The first doped silicon layer 206G' may include a graded concentration of boron. The first doped silicon layer 206G' may include a graded vertical concentration of boron. The boron concentration of the first doped silicon layer 206G' may be lowest at the bottom surface 206GB of the first doped silicon layer 206G' and may have a gradient doping profile in which the boron concentration of the first doped silicon layer 206G' gradually increases away from the bottom surface 206GB of the first doped silicon layer 206G'. FIG. 2A is a schematic simplified view, and the ratio P1 of boron concentration to the vertical distance from the bottom surface 206GB of the first doped silicon layer 206G' is not limited to that shown but may be altered in various slopes.

The boron concentration of the first doped silicon layer 206G' is shown in FIG. 2B. The first doped silicon layer 206G' may include a multi-layer stack of boron-doped silicon layers. The boron concentration of the first doped silicon layer 206G' may include a gradient doping profile in which the boron concentration of the first doped silicon layer 206G' gradually increases from the lowest-level boron-doped silicon layer to the highest-level boron-doped silicon layer. According to an embodiment, the first doped silicon layer 206G' may be a multi-layer stack including a bottom layer, which is at the lowest level, an intermediate layer, which is at an intermediate level higher than the bottom layer, and a top layer, which is at the highest level higher than the intermediate layer. The boron concentration of the first doped silicon layer 206G' may include a gradient doping profile in which the boron concentration of the first doped silicon layer 206G' gradually increases from the bottom to top layer. The ratio PB of boron concentration to the height HB of the bottom layer may be identical to or different from the ratio PM of boron concentration to the height HC of the intermediate layer and the ratio PT of boron concentration to the height HT of the top layer. For example, the ratio PB of boron concentration to the height HB of the bottom layer may be larger than the ratio PM of boron concentration to the height HC of the intermediate layer and the ratio PT of boron concentration to the height HT of the top layer. The ratio PM of boron concentration to the height HC of the intermediate layer may be smaller than the ratio PB of boron concentration to the height HB of the bottom layer and the ratio PT of boron concentration to the height HT of the top layer. The height HB of the bottom layer, the height HC of the intermediate layer, and the height HT of the top layer may be identical to or different from each other. For example, the height HB of the bottom layer may be smaller than the height HC of the intermediate layer and the height HT of the top layer. The height HC of the intermediate layer may be larger than the height HB of the bottom layer and the height HT of the top layer. It is noted that FIG. 2B is a simplified schematic example and the height HB of the bottom layer of the first doped silicon layer 206G', the height HC of the intermediate layer, and the height HT of the top layer are not limited to those shown in the drawings but may include various values. The ratio PB of boron concentration to the height HB of the bottom layer of the first doped silicon layer 206G', the ratio PM of boron concentration to the height HC of the intermediate layer, and the ratio PT of boron concentration to the height HT of the top layer are not limited to those shown therein but may include various values.

The first doped silicon layer 206G' may further include at least one additional dopant selected from among tungsten, carbon, nitrogen, or a combination thereof. Thus, the first doped silicon layer 206G' may be a silicon layer doped with tungsten and boron. The first doped silicon layer 206G' may be a silicon layer doped with carbon and boron, according to an embodiment. The first doped silicon layer 206G' may be a silicon layer doped with tungsten, carbon and boron, according to an embodiment.

The second doped silicon layer 206S' may be formed on the first doped silicon layer 206G'. The thickness 206SH of the second doped silicon layer 206S' may be larger than the thickness 206GH of the first doped silicon layer 206G'. The second doped silicon layer 206S' may include a single boron-doped silicon layer. The thickness 206SH of the single boron-doped silicon layer of the second doped silicon layer 206S' may be larger than the thickness 206GH of the multi-layer stack of boron-doped silicon layers of the first doped silicon layer 206G'. The second doped silicon layer 206S' may include a bottom surface 206SB and a top surface 206ST, and the bottom surface 206SB of the second doped silicon layer 206S' may denote the same surface as the top surface 206SB of the first doped silicon layer 206G'. The bottom surface 206SB of the second doped silicon layer 206S' may have the same boron concentration as the top surface 206ST.

The boron concentration of the second doped silicon layer 206S' may be larger than the boron concentration of the first doped silicon layer 206G'. The second doped silicon layer 206S' may have a non-graded concentration of boron. The second doped silicon layer 206S' may include a non-graded vertical concentration of boron. The boron concentration of the second doped silicon layer 206S' may have a profile in which the boron concentration of the second doped silicon layer 206S' is uniform from the bottom surface 206SB of the second doped silicon layer 206S' to the top surface 206ST. Referring to FIG. 2A, the ratio P2 of boron concentration to the vertical distance 206SH from the bottom surface 206SB of the second doped silicon layer 206S' may be constant. The boron concentration of the second doped silicon layer 206S' may be continuous from the boron concentration of the first doped silicon layer 206G'. Thus, the boron concentration at the bottom surface 206SB of the second doped silicon layer 206S' may be identical to the boron concentration at the highest level of the first doped silicon layer 206G'.

The second doped silicon layer 206S' may further include at least one additional dopant selected from among tungsten, carbon, nitrogen, or a combination thereof. Thus, the second doped silicon layer 206S' may be a silicon layer doped with tungsten and boron. The second doped silicon layer 206S' may be a silicon layer doped with carbon and boron, according to an embodiment. The second doped silicon layer 206S' may be a silicon layer doped with tungsten, carbon and boron, according to an embodiment.

An opening mask 207 may be formed on the second doped silicon layer 206S'. The opening mask 207 may include a photoresist pattern.

Figure 4B:
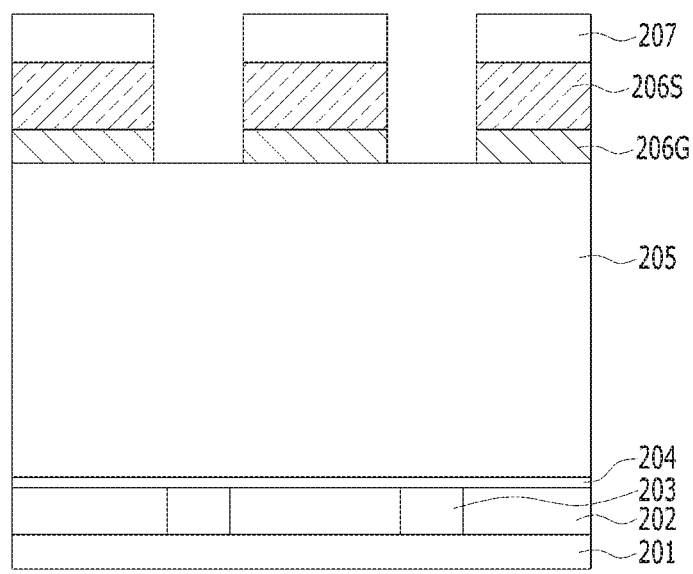

As illustrated in FIG. 4B, the opening mask 207 may be used as an etch mask to selectively remove the second doped silicon layer 206S' and the first doped silicon layer 206G'. Thus, the second doped silicon layer 206S' may become a second boron-doped silicon pattern 206S. The first doped silicon layer 206G' may become a first boron-doped silicon pattern 206G. By the etching process, a portion of the mold layer 205 may be exposed.

Figure 4C:
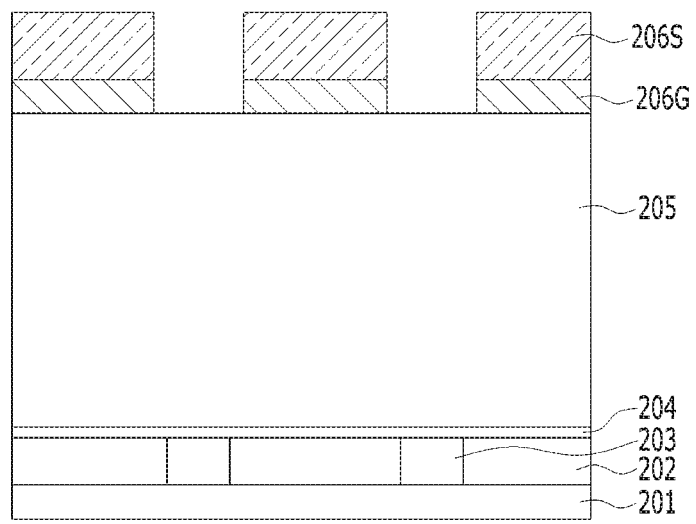

As illustrated in FIG. 4C, the opening mask 207 may be removed. While removing the opening mask 207, the second boron-doped silicon pattern 206S may be thinned. In other words, the thickness of the second boron-doped silicon pattern 206S after the opening mask 207 is removed may be smaller than the thickness of the second boron-doped silicon pattern 206S before the opening mask 207 is removed.

Figure 4D:
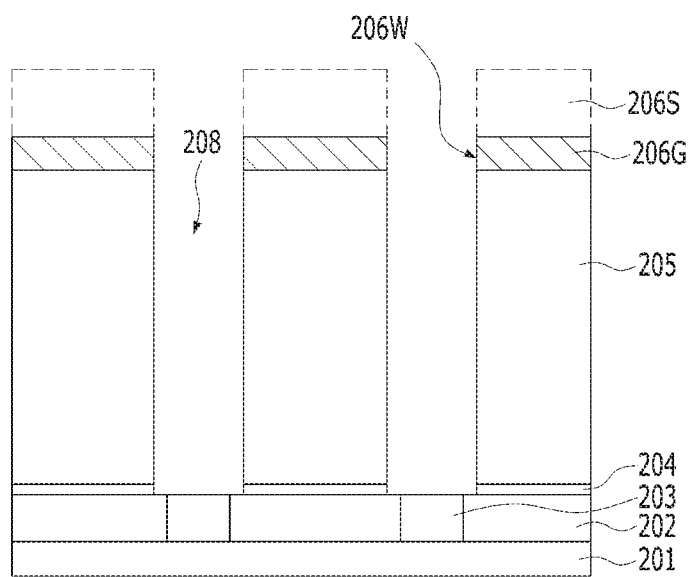

Referring to FIG. 4D, an opening 208 may be formed in the mold layer 205. The opening 208 may be formed by etching the mold layer 205 using the second boron-doped silicon pattern 206S and the first boron-doped silicon pattern 206G as an etch mask. While forming the opening 208, the second boron-doped silicon pattern 206S may be removed. The thickness of the first boron-doped silicon pattern 206G after the opening 208 is formed may be smaller than the thickness of the first boron-doped silicon pattern 206G before the opening 208 is formed. The opening 208 may be formed on the contact plug 203. The opening 208 may be referred to as a hole where a lower electrode (or storage node) is to be formed. An etching process for forming the opening 208 may stop at the etch stop layer 204. Subsequently, the etch stop layer 204 may be etched, exposing the top surface of the contact plug 203 under the opening 208.

By the above-described etching process, a plurality of openings 208 may be formed. Various openings 208 may be formed depending on the difficulty of etching process. For example, as the boron concentration of the first doped silicon layer 206G' reduces, stripping of the first doped silicon layer 206G' may be easier. Thus, a side wall 206W of the first boron-doped silicon pattern 206G may be vertically formed. As the side wall 206W of the first boron-doped silicon pattern 206G is vertically formed, a side wall of the opening 208 may be vertically formed. As the side wall of the opening 208 may be vertically formed, a bad contact with the contact plug 203 may be mitigated, and the capacitance of the capacitor may be increased. To form the opening 208, dry etching, wet etching, or a combination thereof may be used. The opening 208 may have a high aspect ratio. The opening 208 may have an aspect ratio of, at least, 1:1 or more. For example, the opening 208 may have a high aspect ratio of 10:1 or more.

Figure 4E:
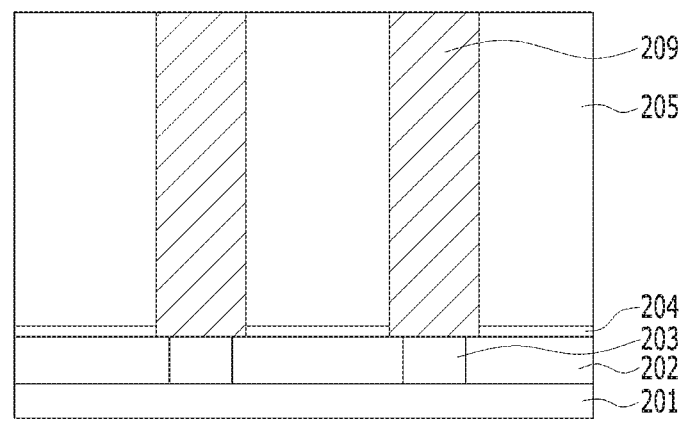

As illustrated in FIG. 4E, the first boron-doped silicon pattern 206G may be removed. Subsequently, a lower electrode layer (not shown) may be formed to cover the opening 208 and the mold layer 205. The lower electrode layer (not shown) may be formed on the contact plug 203. Thus, the lower electrode layer (not shown) may be electrically connected with the contact plug 203. The lower electrode layer (not shown) may include a metal, metal nitride, or a combination thereof. The lower electrode layer (not shown) may include at least one of titanium (Ti), titanium nitride (TIN), tantalum (Ta), tantalum nitride (TaN), titanium-aluminum, titanium-aluminum nitride (TiAlN), tungsten (W), tungsten nitride (WN), ruthenium (Ru), ruthenium oxide (RuO$_2$), iridium (Ir), iridium oxide (IrO$_2$), platinum (Pt), and a combination thereof. According to an embodiment, the lower electrode layer (not shown) may include titanium nitride (TIN). The lower electrode layer (not shown) may include titanium nitride (ALD-TiN) formed by ALD.

Subsequently, a lower electrode separation process may be performed. For example, to form a lower electrode 209 in the opening 208, a portion of the lower electrode layer (not shown) may be selectively removed. The lower electrode separation process may be performed by polishing. For example, the lower electrode 209 may be formed by performing chemical mechanical polishing (CMP) or an etchback on the lower electrode layer (not shown). After the lower electrode 209 is formed, the top surface of the mold layer 205 may be exposed. Thus, the lower electrode 209 may be formed in the opening 208. The lower electrode 209 may include any one shape of a pillar, cylinder, or pylinder. In the instant embodiment, the lower electrode 209 may be pillar-shaped. The lower electrode 209 may have a high aspect ratio. The lower electrode 209 may have an aspect ratio of 10:1 or more.

Figure 4F:
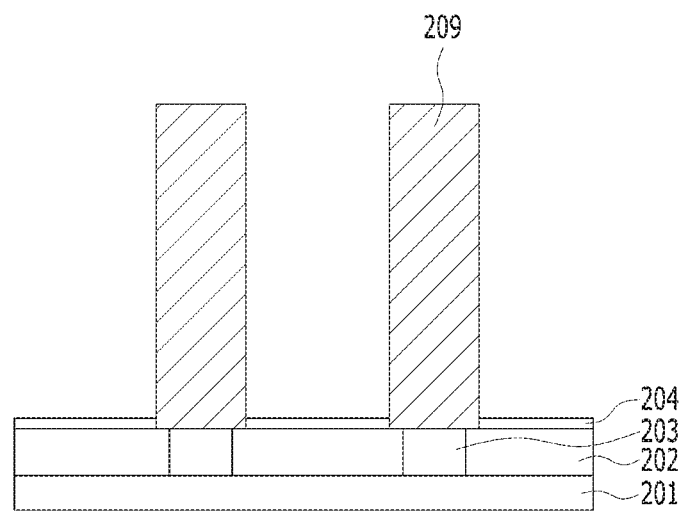

As illustrated in FIG. 4F, the mold layer 205 may be removed. For example, the mold layer 205 may be removed by a wet deep-out process. To remove the mold layer 205, one or more of HF, NH$_4$F/NH$_4$OH, H$_2$O$_2$, HCl, HNO$_3$, H$_2$SO$_4$, or such chemicals may be used. Upon removing the mold layer 205, the etch stop layer 204, which has etch selectivity for the mold layer 205, may not be removed. As the mold layer 205 is removed, the outer wall of the lower electrode 209 may be exposed.

Figure 4G:
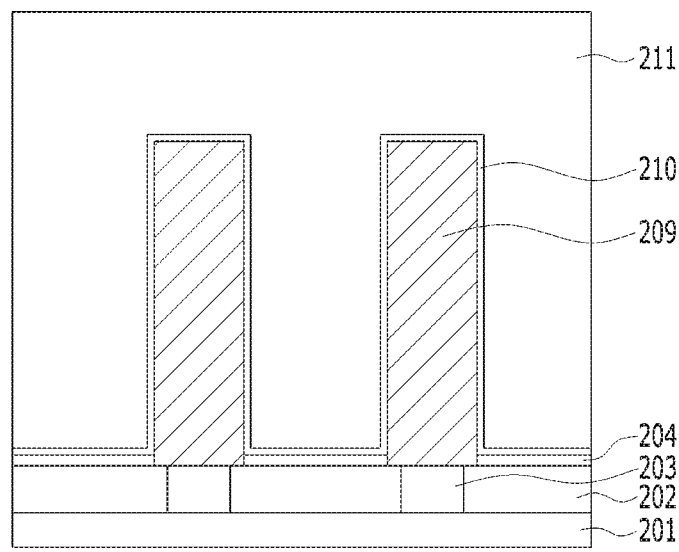

As illustrated in FIG. 4G, a dielectric layer 210 may be formed on the lower electrode 209 and the etch stop layer 204. The dielectric layer 210 may be or include a high-k material which is larger in permittivity than silicon oxide. The high-k material may include zirconium oxide (ZrO$_2$), aluminum oxide (Al$_2$O$_3$), titanium oxide (TiO$_2$), tantalum oxide (Ta$_2$O$_5$), niobium oxide (Nb$_2$O$_5$), or strontium titanium oxide (SrTiO$_3$). Alternatively, the dielectric layer 210 may be formed of a composite layer which includes two or more layers of the high-k materials mentioned above. According to an embodiment, the dielectric layer 210 may be formed of a zirconium oxide-base material that may sufficiently reduce the equivalent oxide thickness (EOT) while providing good leakage current characteristics. For example, the dielectric layer 210 may include any one of ZAZ (ZrO$_2$/Al$_2$O$_3$/ZrO$_2$), TZAZ (TiO$_2$/ZrO$_2$/Al$_2$O$_3$/ZrO$_2$), TZAZT (TiO$_2$/ZrO$_2$/Al$_2$O$_3$/ZrO$_2$/TiO$_2$), ZAZT (ZrO$_2$/Al$_2$O$_3$/ZrO$_2$/TiO$_2$), TZ (TiO$_2$/ZrO$_2$), or ZAZAT (ZrO$_2$/Al$_2$O$_3$/ZrO$_2$/Al$_2$O$_3$/TiO$_2$). In the dielectric layer stack, such as TZAZ, TZAZT, ZAZT, TZ, or ZAZAT, TiO$_2$ may be replaced with Ta$_2$O$_5$. The dielectric layer 210 may be formed using chemical vapor deposition (CVD) or atomic layer deposition (ALD) which has superior step coverage.

An upper electrode 211 may be formed on the dielectric layer 210. The upper electrode 211 may include a metal-base material. For example, the upper electrode 211 may include at least one of titanium (Ti), titanium nitride (TiN), tantalum (Ta), tantalum nitride (TaN), titanium-aluminum nitride (TiAlN), tungsten (W), tungsten nitride (WN), ruthenium (Ru), ruthenium oxide (RuO$_2$), iridium (Ir), iridium oxide (IrO$_2$), platinum (Pt), and a combination thereof. The upper electrode 211 may be formed using lower pressure CVD (LPCVD), PECVD, or ALD. According to an embodiment, the upper electrode 211 may include titanium nitride (ALD-TIN) formed by ALD.

Alternatively, the upper electrode 211 may have a multi-layer structure. The upper electrode 211 may also be formed by sequentially stacking a lower metal-containing layer, a silicon-germanium layer, and an upper metal-containing layer. The lower metal-containing layer and the upper metal-containing layer may include at least one of titanium (Ti), titanium nitride (TiN), tantalum (Ta), tantalum nitride (TaN), titanium-aluminum nitride (TiAlN), tungsten (W), tungsten nitride (WN), ruthenium (Ru), ruthenium oxide (RuO$_2$), iridium (Ir), iridium oxide (IrO$_2$), platinum (Pt), and a combination thereof. For example, the lower metal-containing layer may be a titanium nitride layer, and the upper metal-containing layer may be a WN/W stack of tungsten nitride and tungsten. The silicon-germanium layer may be doped with boron. To form the upper electrode 211, upper electrode layer (not shown) deposition and upper electrode patterning may be performed.

In the instant embodiment, the second doped silicon layer 206S' may be evenly doped with a high-concentration of boron, increasing the etch selectivity for the mold layer 205. Further, since the boron concentration gradually increases as the distance from the bottom surface 206GB of the first doped silicon layer 206G' increases, hard mask stripping may be easily performed. In other words, a high-etch selectivity, easy-to-strip hard mask layer may be formed by forming the second doped silicon layer 206S' and the first doped silicon layer 206G'. Thus, the etch profile of the mold layer 205 may be vertically formed. As the etch file is vertically formed, the processing stability and reliability may be secured for semiconductor devices.

FIGS. 5A to 5I are cross-sectional views illustrating a method for fabricating a semiconductor device according to an embodiment of the present invention. According to an embodiment, a semiconductor device may include a semiconductor element with a capacitor and a supporter.

Figure 5A:
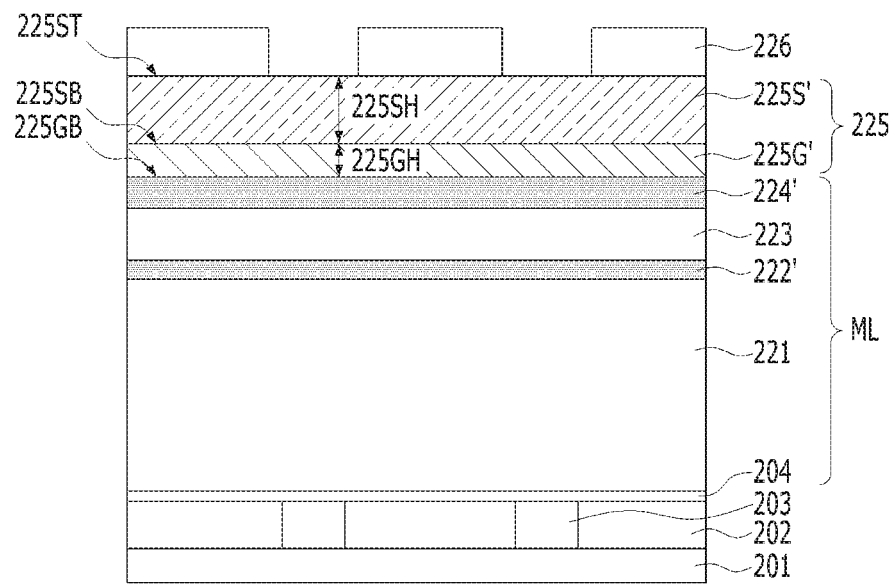
FIGS. 5A, 5B, 5C, 5D, 5E, 5F, 5G, 5H, and 5I are views illustrating a method of manufacturing semiconductor device according to an embodiment of the present disclosure.

Referring to FIG. 5A, an inter-layer insulation layer 202 may be formed on a substrate 201. A contact plug 203 may be formed through the inter-layer insulation layer 202. The contact plug 203 may pass through the inter-layer insulation layer 202 and connect to the substrate 201.

An etch stop layer 204 may be formed on the contact plug 203 and the inter-layer insulation layer 202. The etch stop layer 204 may be or include a silicon nitride. The etch stop layer 204 may be used as an etch endpoint. The etch stop layer 204 may be formed, for example, by chemical vapor deposition (CVD), physical vapor deposition (PVD), or atomic layer deposition (ALD). To increase the deposition effect, the etch stop layer 204 may use a plasma. For example, the etch stop layer 204 may be formed by, e.g., plasma enhanced CVD (PECVD) or plasma enhanced ALD (PEALD).

A mold stack layer ML may be formed on the contact plug 203 and the inter-layer insulation layer 202. The mold stack layer ML may include one or more supporter layers. According to an embodiment, the mold stack layer ML may include two supporter layers. However, embodiments of the disclosure are not limited thereto. For example, the mold stack layer ML may include only one supporter layer or include three or more supporter layers. According to an embodiment, the mold stack layer ML may include an etch stop layer 204, a lower-level supporter layer 222', an upper-level mold layer 223, and an upper-level supporter layer 224'. The height of the lower electrode may be varied depending on the thickness of the mold stack layer ML. The capacitance of the capacitor may be varied depending on the height of the lower electrode. For example, as the height of the mold stack layer ML increases, the capacitance of the capacitor may increase.

The lower-level mold layer 221 may be formed on the etch stop layer 204. The lower-level mold layer 221 may be or include an insulation material. The lower-level mold layer 221 may be or include a borosilicate glass (BSG), phosphosilicate glass (PSG), borophosphosilicate glass (BPSG), or tetra ethyl ortho silicate (TEOS). The lower-level mold layer 221 may be a single layer. Alternatively, the lower-level mold layer 221 may have a multi-layer structure with at least two or more layers. For example, a BPSG layer and a TEOS layer may be stacked.

The lower-level supporter layer 222' may be formed on the lower-level mold layer 221. The thickness of the lower-level supporter layer 222' may be smaller than the thickness of the lower-level mold layer 221. The difficulty of etching process may be reduced according to the thickness of the lower-level supporter layer 222'. For example, as the thickness of the lower-level supporter layer 222' decreases, the difficulty of etching process may be reduced. As the difficulty of etching process reduces, the capacitance of the capacitor may increase. The lower-level supporter layer 222' may be formed of a material having etch selectivity for the lower-level mold layer 221. The lower-level supporter layer 222' may include a nitrogen-containing material. The lower-level supporter layer 222' may be or include silicon nitride, silicon carbon nitride (SiCN), or a combination thereof.

The upper-level mold layer 223 may be formed on the lower-level supporter layer 222'. The upper-level mold layer 223 may be or include an insulation material. The upper-level mold layer 223 may be or include a borosilicate glass (BSG), phosphosilicate glass (PSG), borophosphosilicate glass (BPSG), or tetra ethyl ortho silicate (TEOS). The upper-level mold layer 223 may include a material which is identical to or different from the lower-level mold layer 221. The upper-level mold layer 223 may be a single layer. Alternatively, the upper-level mold layer 223 may have a multi-layer structure with at least two or more layers. For example, a BPSG layer and a TEAS layer may be stacked. The thickness of the upper-level mold layer 223 may be identical to or different from the thickness of the lower-level mold layer 221. For example, the thickness of the upper-level mold layer 223 may be identical to or smaller than the thickness of the lower-level mold layer 221.

The upper-level supporter layer 224' may be formed on the upper-level mold layer 223. The thickness of the upper-level supporter layer 224' may be smaller than the thickness of the upper-level mold layer 223. The thickness of the upper-level supporter layer 224' may be identical to or different from the lower-level supporter layer 222'. For example, the thickness of the upper-level supporter layer 224' may be larger than the thickness of the lower-level supporter layer 222'. The upper-level supporter layer 224' may be formed of a material having etch selectivity for the upper-level mold layer 223. The upper-level supporter layer 224' may include a nitrogen-containing material. The upper-level supporter layer 224' may be or include silicon nitride, silicon carbon nitride (SiCN), silicon boron nitride (SiBN), or a combination thereof. The upper-level supporter layer 224' may include a material which is identical to or different from the lower-level supporter layer 222'.

A hard mask layer 225 may be formed on the upper-level supporter layer 224'. The hard mask layer 225 may be formed to define at least one or more openings in the mold stack layer ML. The hard mask layer 225 may have a multi-layer structure. According to an embodiment, the hard mask layer 225 may have a dual-layer structure. The hard mask layer 225 may include a first doped silicon layer 225G' and a second doped silicon layer 225S'. The dopant in the first and second doped silicon layers 225G' and 225S' may be boron. According to an embodiment, the first doped silicon layer 225G' and the second doped silicon layer 225S' may be ones into which one hard mask layer 225 is divided depending on the concentration gradient of boron. Alternatively, the first doped silicon layer 225G' and the second doped silicon layer 225S' may include two independent hard mask layers.

The hard mask layer 225 may be formed, for example, of any one of polysilicon, an oxide film, a nitride film, or a combination thereof. According to an embodiment, the hard mask layer 225 may be formed of polysilicon. The hard mask layer 225 may be doped with a dopant. The etch selectivity for the mold stack layer ML of the hard mask layer 225 may increase as the concentration of the dopant increases. The hard mask layer 225 may be a boron-doped layer. According to an embodiment, the hard mask layer 225 may be a boron-doped silicon (Si) layer formed by doping a polysilicon layer with boron. The hard mask layer 225 may be formed using, for example, a $B_2H_6$ gas and a $SiH_4$ gas. The hard mask layer 225 may further include, in a variation of this embodiment, an additional dopant. The additional dopant may be, for example, at least any one selected from among tungsten (W), carbon (C), nitrogen (N), or a combination thereof. For example, the hard mask layer 225 may be a silicon layer doped with tungsten and boron. The hard mask layer 225 may be a silicon layer doped with carbon and boron, according to an embodiment. The hard mask layer 225 may be a silicon layer doped with tungsten, carbon and boron, according to an embodiment.

The first doped silicon layer 225G' may be or include a low-concentration boron-doped silicon layer, and the second doped silicon layer 225S' may be or include a high-concentration boron-doped silicon layer. The first doped silicon layer 225G' may have a first boron concentration at which stripping proceeds more rapidly than the second doped silicon layer 225S'. The second doped silicon layer 225S' may have a second boron concentration at which the etch selectivity for the mold stack layer ML is rendered larger than the first doped silicon layer 225G'. Any one of the first doped silicon layer 225G' and the second doped silicon layer 225S' may further include, in a variation of this embodiment, an additional dopant. The additional dopant may be, for example, at least anyone selected from among tungsten, carbon, nitrogen, or a combination thereof. For example, any one of the first doped silicon layer 225G' or the second doped silicon layer 225S' may be or include a silicon layer doped with tungsten and boron. Alternatively, any one of the first doped silicon layer 225G' or the second doped silicon layer 225S' may be or include a silicon layer doped with carbon and boron, according to an embodiment. Any one of the first doped silicon layer 225G' or the second doped silicon layer 225S' may be or include a silicon layer doped with tungsten, carbon and boron, according to an embodiment.

The hard mask layer 225 may be formed, for example, by chemical vapor deposition (CVD), physical vapor deposition (PVD), or atomic layer deposition (ALD). To increase the deposition effect, the hard mask layer 225 may use a plasma. For example, the hard mask layer 225 may be formed by, e.g., plasma enhanced CVD (PECVD) or plasma enhanced ALD (PEALD). According to an embodiment, the hard mask layer 225 may be formed, via PECVD, using a $SiH_4$ gas and a $B_2H_6$ gas.

The first doped silicon layer 225G' may be formed on the upper-level supporter layer 224'. The first doped silicon layer 225G' may include a bottom surface 225GB and a top surface 225SB. The boron concentration at the bottom surface 225GB of the first doped silicon layer 225G' may differ from the boron concentration at the top surface 225SB of the first doped silicon layer 225G'.

The boron concentration of the first doped silicon layer 225G' is shown in FIG. 2A. The first doped silicon layer 225G' may include a graded concentration of boron. The first doped silicon layer 225G' may include a graded vertical concentration of boron. The boron concentration of the first doped silicon layer 225G' may be lowest at the bottom surface 225GB of the first doped silicon layer 225G' and may have a gradient doping profile in which the boron concentration of the first doped silicon layer 225G' gradually increases away from the bottom surface 225GB of the first doped silicon layer 225G'. FIG. 2A is a schematic simplified view, and the ratio P1 of boron concentration to the vertical distance from the bottom surface 225GB of the first doped silicon layer 225G' is not limited to that shown but may be altered in various slopes.

The boron concentration of the first doped silicon layer 225G' is shown in FIG. 2B. The first doped silicon layer 225G' may include a multi-layer stack of boron-doped silicon layers. The boron concentration of the first doped silicon layer 225G' may include a gradient doping profile in which the boron concentration of the first doped silicon layer 225G' gradually increases from the lowest-level boron-doped silicon layer to the highest-level boron-doped silicon layer. According to an embodiment, the first doped silicon layer 225G' may be a multi-layer stack including a bottom layer, which is at the lowest level, an intermediate layer, which is at an intermediate level higher than the bottom layer, and a top layer, which is at the highest level higher than the intermediate layer. The boron concentration of the first doped silicon layer 225G' may include a gradient doping profile in which the boron concentration of the first doped silicon layer 225G' gradually increases from the bottom to top layer. The ratio PB of boron concentration to the height HB of the bottom layer may be identical to or different from the ratio PM of boron concentration to the height HC of the intermediate layer and the ratio PT of boron concentration to the height HT of the top layer. For example, the ratio PB of boron concentration to the height HB of the bottom layer may be larger than the ratio PM of boron concentration to the height HC of the intermediate layer and the ratio PT of boron concentration to the height HT of the top layer. The ratio PM of boron concentration to the height HC of the intermediate layer may be smaller than the ratio PB of boron concentration to the height HB of the bottom layer and the ratio PT of boron concentration to the height HT of the top layer. The height HB of the bottom layer, the height HC of the intermediate layer, and the height HT of the top layer may be identical to or different from each other. For example, the height HB of the bottom layer may be smaller than the height HC of the intermediate layer and the height HT of the top layer. The height HC of the intermediate layer may be larger than the height HB of the bottom layer and the height HT of the top layer. It is noted that FIG. 2B is a simplified schematic example and the height HB of the bottom layer of the first doped silicon layer 225G', the height HC of the intermediate layer, and the height HT of the top layer are not limited to those shown in the drawings but may include various values. The ratio PB of boron concentration to the height HB of the bottom layer of the first doped silicon layer 225G', the ratio PM of boron concentration to the height HC of the intermediate layer, and the ratio PT of boron concentration to the height HT of the top layer are not limited to those shown therein but may include various values.

The first doped silicon layer 225G' may further include at least one additional dopant selected from among tungsten, carbon, nitrogen, or a combination thereof. Thus, the first doped silicon layer 225G' may be a silicon layer doped with tungsten and boron. The first doped silicon layer 225G' may be a silicon layer doped with carbon and boron, according to an embodiment. The first doped silicon layer 225G' may be a silicon layer doped with tungsten, carbon and boron, according to an embodiment.

The second doped silicon layer 225S' may be formed on the first doped silicon layer 225G'. The thickness 225SH of the second doped silicon layer 225S' may be larger than the thickness 225GH of the first doped silicon layer 225G'. The second doped silicon layer 225S' may include a single boron-doped silicon layer. The thickness 225SH of the single boron-doped silicon layer of the second doped silicon layer 225S' may be larger than the thickness 225GH of the multi-layer stack of boron-doped silicon layers of the first doped silicon layer 225G'. The second doped silicon layer 225S' may include a bottom surface 225SB and a top surface 225ST, and the bottom surface 225SB of the second doped silicon layer 225S' may denote the same surface as the top surface 225SB of the first doped silicon layer 225G'. The bottom surface 225SB of the second doped silicon layer 225S' may have the same boron concentration as the top surface 225ST.

The boron concentration of the second doped silicon layer 225S' may be larger than the boron concentration of the first doped silicon layer 225G'. The second doped silicon layer 225S' may have a non-graded concentration of boron. The second doped silicon layer 225S' may include a non-graded vertical concentration of boron. The boron concentration of the second doped silicon layer 225S' may have a profile in which the boron concentration of the second doped silicon layer 225S' is uniform from the bottom surface 225SB of the second doped silicon layer 225S' to the top surface 225ST. Referring to FIG. 2A, the ratio P2 of boron concentration to the vertical distance 225SH from the bottom surface 225SB of the second doped silicon layer 225S' may be constant. The boron concentration of the second doped silicon layer 225S' may be continuous from the boron concentration of the first doped silicon layer 225G'. Thus, the boron concentration at the bottom surface 225SB of the second doped silicon layer 225S' may be identical to the boron concentration at the highest level of the first doped silicon layer 225G'.

The second doped silicon layer 225S' may further include at least one additional dopant selected from among tungsten, carbon, nitrogen, or a combination thereof. Thus, the second doped silicon layer 225S' may be a silicon layer doped with tungsten and boron. The second doped silicon layer 225S' may be a silicon layer doped with carbon and boron, according to an embodiment. The second doped silicon layer 225S' may be a silicon layer doped with tungsten, carbon and boron, according to an embodiment.

An opening mask 226 may be formed on the second doped silicon layer 225S'. The opening mask 226 may include a photoresist pattern.

Figure 5B:
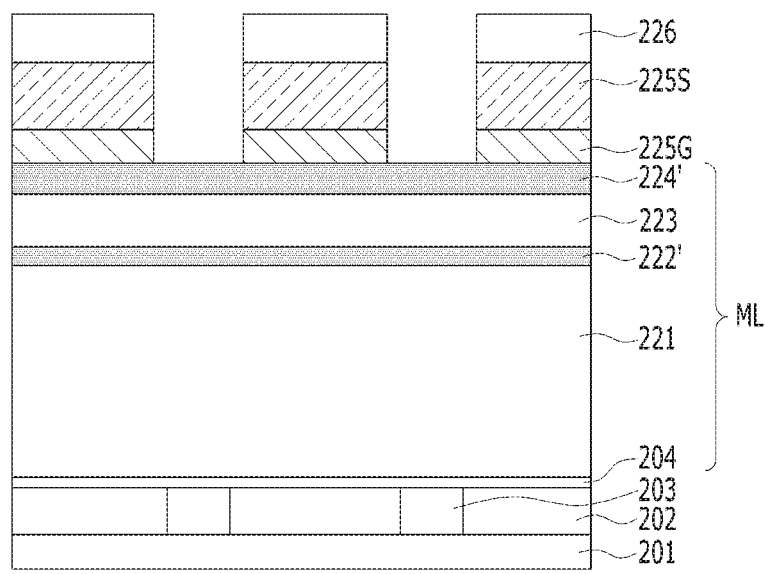

As illustrated in FIG. 5B, the opening mask 226 may be used as an etch mask to selectively remove the second doped silicon layer 225S' and the first doped silicon layer 225G'. Thus, the second doped silicon layer 225S' may become a second boron-doped silicon pattern 225S. The first doped silicon layer 225G' may become a first boron-doped silicon pattern 225G. By the etching process, a portion of the upper-level supporter layer 224' may be exposed.

Figure 5C:
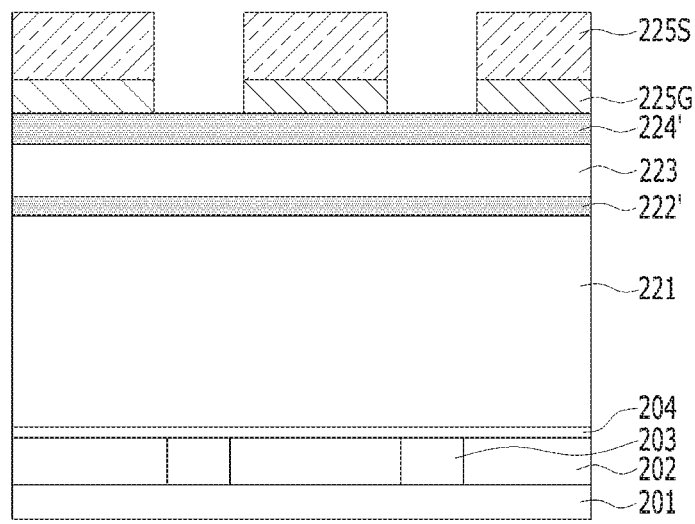

As illustrated in FIG. 5C, the opening mask 226 may be removed. While removing the opening mask 226, the second boron-doped silicon pattern 225S may be thinned. In other words, the thickness of the second boron-doped silicon pattern 225S after the opening mask 226 is removed may be smaller than the thickness of the second boron-doped silicon pattern 225S before the opening mask 226 is removed.

Figure 5D:
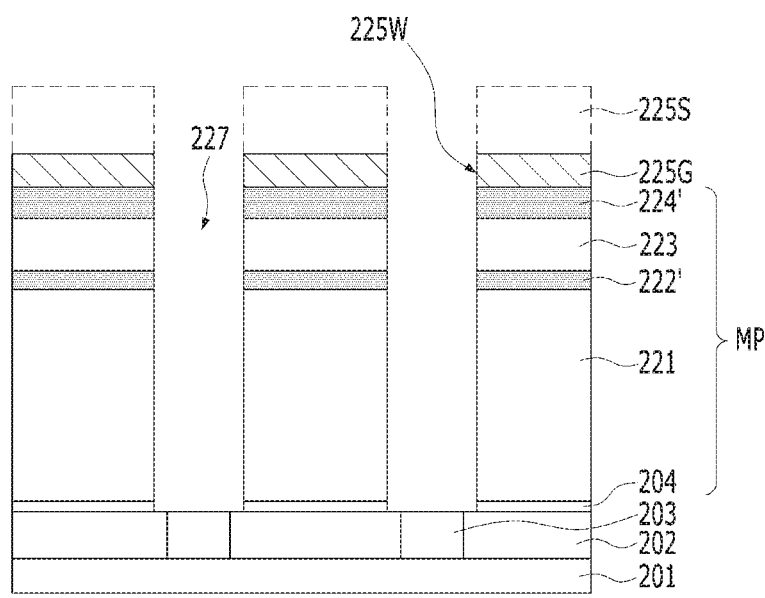

Referring to FIG. 5D, an opening 227 may be formed in the mold stack layer ML. The opening 227 may be formed by etching the mold stack layer ML using the second boron-doped silicon pattern 225S and the first boron-doped silicon pattern 225G as an etch mask. To form the opening 227, the upper-level supporter layer 224', upper-level mold layer 223, lower-level supporter layer 222', and lower-level mold layer 221 may sequentially be etched using the second boron-doped silicon pattern 225S and the first boron-doped silicon pattern 225G as an etch mask. An etching process for forming the opening 227 may stop at the etch stop layer 204. Subsequently, the etch stop layer 204 may be etched, exposing the top surface of the contact plug 203 under the opening 227. While forming the opening 227, the second boron-doped silicon pattern 225S may be removed. The thickness of the first boron-doped silicon pattern 225G after the opening 227 is formed may be smaller than the thickness of the first boron-doped silicon pattern 225G before the opening 227 is formed. The opening 227 may be formed on the contact plug 203. The opening 227 may be referred to as a hole where a lower electrode (or storage node) is to be formed.

By the above-described etching process, a mold stack pattern MP including a plurality of openings 227 may be formed. In this case, various openings 227 may be formed depending on the difficulty of etching process. For example, as the boron concentration of the first doped silicon layer 225G' reduces, stripping of the first doped silicon layer 225G' may be easier. Thus, a side wall 225W of the first boron-doped silicon pattern 225G may be vertically formed. As the side wall 225W of the first boron-doped silicon pattern 225G is vertically formed, a side wall of the opening 227 may be vertically formed. As the side wall of the opening 227 may be vertically formed, a bad contact with the contact plug 203 may be mitigated, and the capacitance of the capacitor may be increased. To form the opening 227, dry etching, wet etching, or a combination thereof may be used. The opening 227 may have a high aspect ratio. The opening 227 may have an aspect ratio of, at least, 1:1 or more. For example, the opening 227 may have a high aspect ratio of 10:1 or more.

Figure 5E:
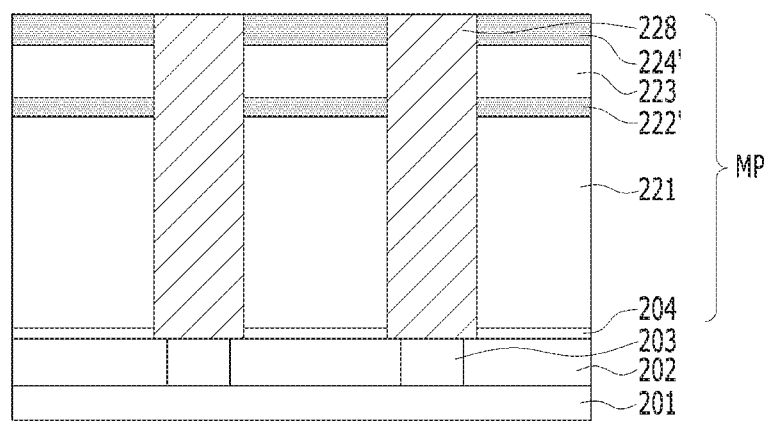

As illustrated in FIG. 5E, the first boron-doped silicon pattern 225G may be removed. Subsequently, a lower electrode layer (not shown) may be formed to cover the opening 227 and the mold stack pattern MP. The lower electrode layer (not shown) may be formed on the contact plug 203. Thus, the lower electrode layer (not shown) may be electrically connected with the contact plug 203. The lower electrode layer (not shown) may include a metal, metal nitride, or a combination thereof. The lower electrode layer (not shown) may include at least one of titanium (Ti), titanium nitride (TiN), tantalum (Ta), tantalum nitride (TaN), titanium-aluminum, titanium-aluminum nitride (TiAlN), tungsten (W), tungsten nitride (WN), ruthenium (Ru), ruthenium oxide (RuO2), iridium (Ir), iridium oxide (IrO2), platinum (Pt), and a combination thereof. According to an embodiment, the lower electrode layer (not shown) may include titanium nitride (TiN). The lower electrode layer (not shown) may include titanium nitride (ALD-TiN) formed by ALD.

Subsequently, a lower electrode separation process may be performed. For example, to form a lower electrode 228 in the opening 227, a portion of the lower electrode layer (not shown) may be selectively removed. The lower electrode separation process may be performed by polishing. For example, the lower electrode 228 may be formed by performing chemical mechanical polishing (CMP) or an etch-back on the lower electrode layer (not shown). Thus, the lower electrode 228 may be formed in the opening 227. After the lower electrode 228 is formed, the top surface of the upper-level supporter layer 224' may be exposed. Thus, the lower electrode 228 may be formed in the opening 227. The lower electrode 228 may include any one shape of a pillar, cylinder, or pylinder. In the instant embodiment, the lower electrode 228 may be pillar-shaped. The lower electrode 228 may have a high aspect ratio. The lower electrode 228 may have an aspect ratio of 10:1 or more.

Figure 5F:
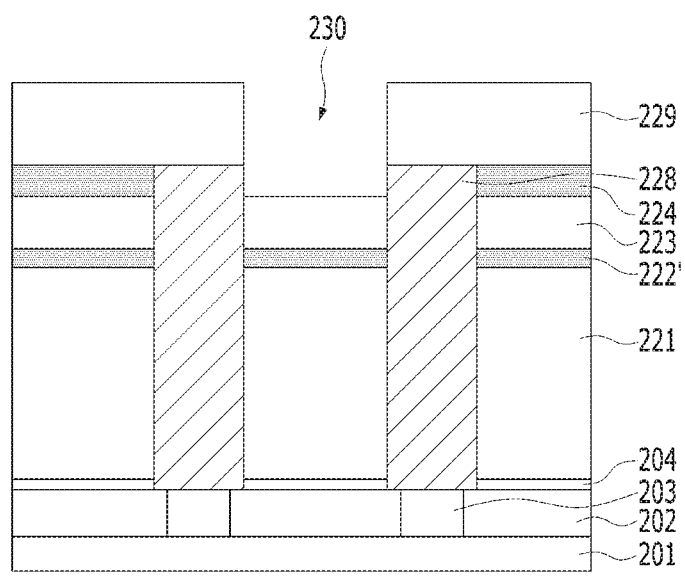

Referring to FIG. 5F, an upper-level supporter 224 may be formed to support the upper outer wall of the lower electrode 228. To form the upper-level supporter 224, the upper-level supporter layer 224' may be etched using the opening mask 229. The opening mask 229 may include a photoresist pattern or a hard mask pattern. The upper-level supporter layer 224' exposed by the opening mask 229 may be selectively etched. An upper-level opening 230 may be formed by etching the upper-level supporter layer 224'. The upper-level supporter 224 may include a plurality of upper-level openings 230. By the upper-level opening 230, some surfaces of the upper-level mold layer 223 may be exposed.

Figure 5G:
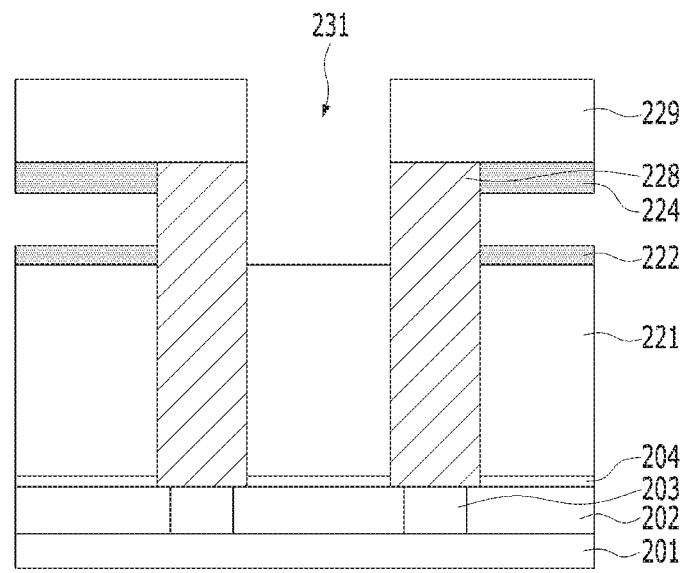

As illustrated in FIG. 5G, the upper-level mold layer 223 may be removed. For example, the upper-level mold layer 223 may be removed by a wet deep-out process. Wet chemicals for removing the upper-level mold layer 223 may be fed via the upper-level opening 230. As the wet chemicals, one or more of HF, $NH_4F/NH_4OH$, $H_2O_2$, HCl, $HNO_3$, $H_2SO_4$, or such chemicals may be used. Upon removing the upper-level mold layer 223, the upper-level supporter 224 and lower-level supporter layer 222', which have etch selectivity for the upper-level mold layer 223, may not be removed. As the upper-level mold layer 223 is removed, the upper outer wall of the lower electrode 228 may be exposed. In this case, the upper outer wall of the lower electrode 228 may be supported by the upper-level supporter 224. Thus, the lower electrode 228 may be prevented from collapsing.

Subsequently, a lower-level supporter 222 may be formed. To form the lower-level supporter 222, the lower-level supporter layer 222' may be selectively etched using the opening mask 229. The lower-level supporter layer 222' may be selectively etched to be self-aligned with the upper-level supporter 224. A lower-level opening 231 may be formed by etching the lower-level supporter layer 222'. The lower-level supporter layer 222' may include a plurality of lower-level openings 231. By the lower-level opening 231, some surfaces of the lower-level mold layer 221 may be exposed.

Figure 5H:
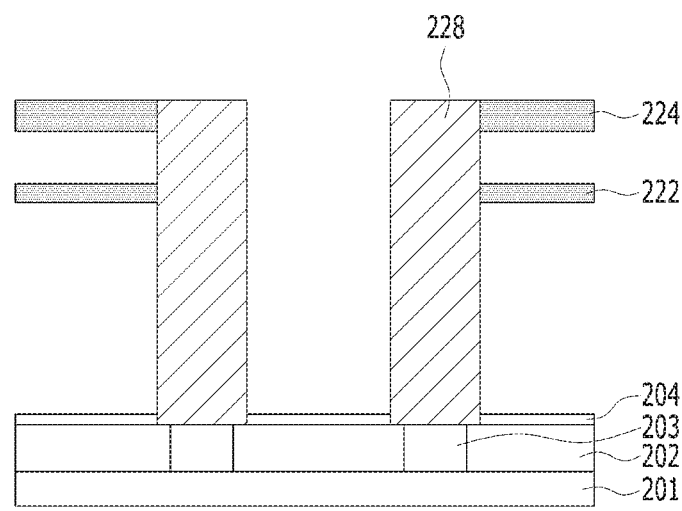

As illustrated in FIG. 5H, the lower-level mold layer 221 may be removed. For example, the lower-level mold layer 221 may be removed by a wet deep-out process. Wet chemicals for removing the lower-level mold layer 221 may be fed via the lower-level opening 231. As the wet chemicals, one or more of HF, $NH_4F/NH_4OH$, $H_2O_2$, HCl, $HNO_3$, $H_2SO_4$, or such chemicals may be used. Upon removing the lower-level mold layer 221, the upper-level supporter 224 and lower-level supporter 222, which have etch selectivity for the lower-level mold layer 221, may not be removed. Upon removing the lower-level mold layer 221, the etch stop layer 204 may prevent damage to the inter-layer insulation layer 202 and the contact plug 203. As the lower-level mold layer 221 is removed, the outer wall of the lower electrode 228 may be exposed. In this case, a middle portion of the lower electrode 228 may be supported by the lower-level supporter 222.

Figure 5I:
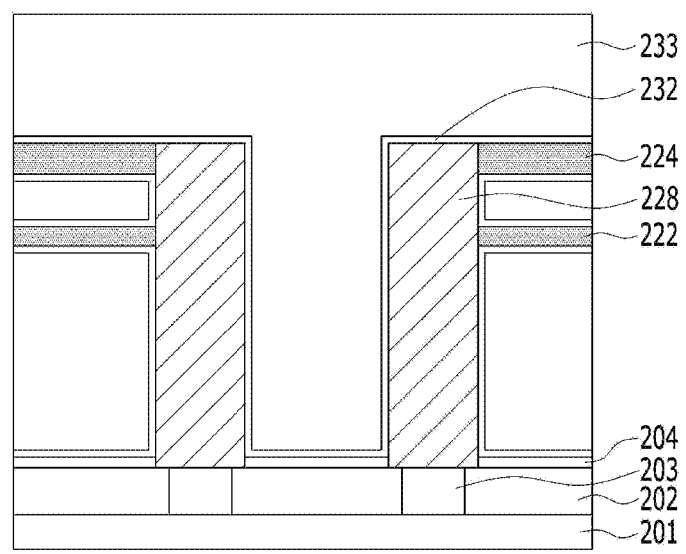

Referring to FIG. 5I, a dielectric layer 232 may be formed. The dielectric layer 232 may be formed on the top and side wall of the lower electrode 228, the top and bottom of the lower-level supporter 222, and the top and bottom of the upper-level supporter 224. A portion of the dielectric layer 232 may cover the etch stop layer 204. The dielectric layer 232 may cover the lower-level supporter 222 and the upper-level supporter 224.

An upper electrode 233 may be formed on the dielectric layer 232. The dielectric layer 232 may be formed on the lower electrode 228 and the etch stop layer 204. The dielectric layer 232 may be or include a high-k material which is larger in permittivity than silicon oxide. The high-k material may include zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). Alternatively, the dielectric layer 232 may be formed of a composite layer which includes two or more layers of the high-k materials mentioned above. According to an embodiment, the dielectric layer 232 may be formed of a zirconium oxide-base material that may sufficiently reduce the equivalent oxide thickness (EOT) while providing good leakage current characteristics. For example, the dielectric layer 232 may include any one of ZAZ ($ZrO_2/Al_2O_3/ZrO_2$), TZAZ ($TiO_2/ZrO_2/Al_2O_3/ZrO_2$), TZAZT ($TiO_2/ZrO_2/Al_2O_3/ZrO_2/TiO_2$), ZAZT ($ZrO_2/Al_2O_3/ZrO_2/TiO_2$), TZ ($TiO_2/ZrO_2$), or ZAZAT ($ZrO_2/Al_2O_3/ZrO_2/Al_2O_3/TiO_2$). In the dielectric layer stack, such as TZAZ, TZAZT, ZAZT, TZ, or ZAZAT, $TiO_2$ may be replaced with $Ta_2O_5$. The dielectric layer 232 may be formed using chemical vapor deposition (CVD) or atomic layer deposition (ALD) which has superior step coverage.

An upper electrode 233 may be formed on the dielectric layer 232. The upper electrode 233 may include a metal-base material. For example, the upper electrode 233 may include at least one of titanium (Ti), titanium nitride (TiN), tantalum (Ta), tantalum nitride (TaN), titanium-aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), and a combination thereof. The upper electrode 233 may be formed using lower pressure CVD (LPCVD), PECVD, or ALD. According to an embodiment, the upper electrode 233 may include titanium nitride (ALD-TiN) formed by ALD.

Alternatively, the upper electrode 233 may have a multi-layer structure. The upper electrode 233 may also be formed by sequentially stacking a lower metal-containing layer, a silicon-germanium layer, and an upper metal-containing layer. The lower metal-containing layer and the upper metal-containing layer may include at least one of titanium (Ti), titanium nitride (TiN), tantalum (Ta), tantalum nitride (TaN), titanium-aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), and a combination thereof. For example, the lower metal-containing layer may be a titanium nitride layer, and the upper metal-containing layer may be a WN/W stack of tungsten nitride and tungsten. The silicon-germanium layer may be doped with boron. To form the upper electrode 233, upper electrode layer (not shown) deposition and upper electrode patterning may be performed.

In the instant embodiment, the second doped silicon layer 225S' may be evenly doped with a high-concentration of boron, increasing the etch selectivity for the mold stack layer ML. Further, since the boron concentration gradually increases as the distance from the bottom surface 225GB of the first doped silicon layer 225G' increases, hard mask stripping may be easily performed. In other words, a high-etch selectivity, easy-to-strip hard mask layer may be formed by forming the second doped silicon layer 225S' and the first doped silicon layer 225G'. Thus, the etch profile of the mold stack layer ML may be vertically formed. As the etch file is vertically formed, the processing stability and reliability may be secured for semiconductor devices.

FIGS. 6A to 6G are cross-sectional views illustrating a method for fabricating a semiconductor device according to an embodiment of the present invention. According to an embodiment, a semiconductor device may include a non-volatile memory device. According to an embodiment, the semiconductor device may include a semiconductor element with a vertical channel.

Figure 6A:
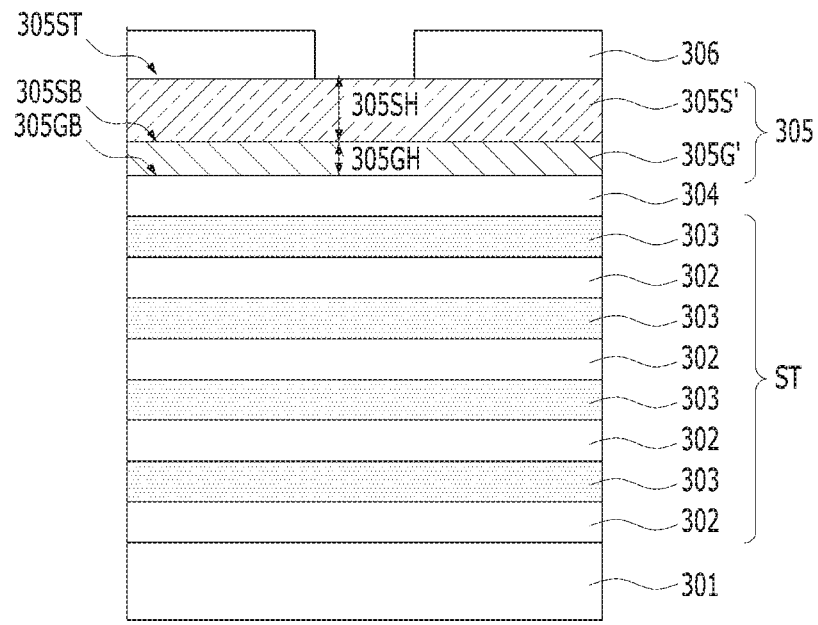
FIGS. 6A, 6B, 6C, 6D, 6E, 6F, and 6G are views illustrating a method of manufacturing semiconductor device according to an embodiment of the present disclosure.

Referring to FIG. 6A, a substrate 301 may be prepared. The substrate 301 may include any material suitable for semiconductor processing. The substrate 301 may include a semiconductor substrate. The substrate 301 may be formed, for example, of a silicon-containing material. The substrate 301 may be or include silicon, monocrystalline silicon, polysilicon, amorphous silicon, silicon-germanium, monocrystalline silicon-germanium, polycrystalline silicon-germanium, carbon-doped silicon, a combination thereof, and may be a single layer or a multi-layer structure thereof. The substrate 301 may be or include other semiconductor material, e.g., germanium. The substrate 301 may be or include a compound semiconductor substrate, e.g., a group-IIIV semiconductor substrate, such as of GaAs. The substrate 301 may be or include a silicon-on-insulator (SOI) substrate.

Insulation layers 302 and sacrificial layers 303 may be alternately and repetitively stacked on the substrate 301, thereby forming an alternate stack ST. According to an embodiment, the insulation layers 302 may include four layers, and the sacrificial layers 303 may include four layers. However, embodiments of the disclosure are not limited thereto. For example, the alternate stack may include various numbers of insulation layers 302 and various numbers of sacrificial layers 303. The sacrificial layers 303 may have etch selectivity for the insulation layers 302. For example, the insulation layers 302 may be oxide layers, and the sacrificial layers 303 may be nitride layers. The insulation layers 302 may be silicon oxide layers, and the sacrificial layers 303 may be silicon nitride layers. The alternate stack ST may be a stack of a plurality of silicon oxide layers and a plurality of silicon nitride layers alternately and repetitively stacked.

A capping layer 304 may be formed on the alternate stack ST. The capping layer 304 may be or include an insulation material. For example, the capping layer 304 may be or include silicon oxide (SiO2).

A hard mask layer 305 may be formed on the capping layer 304. The hard mask layer 305 may be formed to define at least one or more openings in the alternate stack ST. The hard mask layer 305 may have a multi-layer structure. According to an embodiment, the hard mask layer 305 may have a dual-layer structure. The hard mask layer 305 may include a first doped silicon layer 305G' and a second doped silicon layer 305S'. The dopant in the first and second doped silicon layer 305G' and 305S' may be boron. According to an embodiment, although the first doped silicon layer 305G' and the second doped silicon layer 305S' are separated from each other to describe the hard mask layer 305, the first doped silicon layer 305G' and the second doped silicon layer 305S' may be ones into which one hard mask layer 305 is divided depending on the concentration gradient of boron. Alternatively, the first doped silicon layer 305G' and the second doped silicon layer 305S' may include two independent hard mask layers.

The hard mask layer 305 may be formed, for example, of any one of polysilicon, an oxide film, a nitride film, or a combination thereof. According to an embodiment, the hard mask layer 305 may be formed of polysilicon. The hard mask layer 305 may be doped with a dopant. The etch selectivity for the alternate stack ST of the hard mask layer 305 may increase as the concentration of the dopant increases. The hard mask layer 305 may be a boron-doped layer. According to an embodiment, the hard mask layer 305 may be a boron-doped silicon (Si) layer formed by doping a polysilicon layer with boron. The hard mask layer 305 may be formed using, for example, a $B_2H_6$ gas and a $SiH_4$ gas. The hard mask layer 305 may further include, in a variation of this embodiment, an additional dopant. The additional dopant may be, for example, at least any one selected from among tungsten (W), carbon (C), nitrogen (N), or a combination thereof. For example, the hard mask layer 305 may be a silicon layer doped with tungsten and boron. The hard mask layer 305 may be a silicon layer doped with carbon and boron, according to an embodiment. The hard mask layer 305 may be a silicon layer doped with tungsten, carbon and boron, according to an embodiment.

The first doped silicon layer 305G' may be or include a low-concentration boron-doped silicon layer, and the second doped silicon layer 305S' may be or include a high-concentration boron-doped silicon layer. The first doped silicon layer 305G' may have a first boron concentration at which stripping proceeds more rapidly than the second doped silicon layer 305S'. The second doped silicon layer 305S' may have a second boron concentration at which the etch selectivity for the alternate stack ST is rendered larger than the first doped silicon layer 305G'. Any one of the first doped silicon layer 305G' and the second doped silicon layer 305S' may further include, in a variation of this embodiment, an additional dopant. The additional dopant may be, for example, at least any one selected from among tungsten, carbon, nitrogen, or a combination thereof. For example, any one of the first doped silicon layer 305G' or the second doped silicon layer 305S' may be or include a silicon layer doped with tungsten and boron. Alternatively, any one of the first doped silicon layer 305G' or the second doped silicon layer 305S' may be or include a silicon layer doped with carbon and boron, according to an embodiment. Any one of the first doped silicon layer 305G' or the second doped silicon layer 305S' may be or include a silicon layer doped with tungsten, carbon and boron, according to an embodiment.

The hard mask layer 305 may be formed, for example, by chemical vapor deposition (CVD), physical vapor deposition (PVD), or atomic layer deposition (ALD). To increase the deposition effect, the hard mask layer 305 may use a plasma. For example, the hard mask layer 305 may be formed by, e.g., plasma enhanced CVD (PECVD) or plasma enhanced ALD (PEALD). According to an embodiment, the hard mask layer 305 may be formed, via PECVD, using a $SiH_4$ gas and a $B_2H_6$ gas.

The first doped silicon layer 305G' may be formed on the alternate stack ST. The first doped silicon layer 305G' may include a bottom surface 305GB and a top surface 305SB. The boron concentration at the bottom surface 305GB of the first doped silicon layer 305G' may differ from the boron concentration at the top surface 305SB of the first doped silicon layer 305G'.

The boron concentration of the first doped silicon layer 305G' is shown in FIG. 2A. The first doped silicon layer 305G' may include a graded concentration of boron. The first doped silicon layer 305G' may include a graded vertical concentration of boron. The boron concentration of the first doped silicon layer 305G' may be lowest at the bottom surface 305GB of the first doped silicon layer 305G' and may have a gradient doping profile in which the boron concentration of the first doped silicon layer 305G' gradually increases away from the bottom surface 305GB of the first doped silicon layer 305G'. FIG. 2A is a schematic simplified view, and the ratio P1 of boron concentration to the vertical distance from the bottom surface 305GB of the first doped silicon layer 305G' is not limited to that shown but may be altered in various slopes.

The boron concentration of the first doped silicon layer 305G' is shown in FIG. 2B. The first doped silicon layer 305G' may include a multi-layer stack of boron-doped silicon layers. The boron concentration of the first doped silicon layer 305G' may include a gradient doping profile in which the boron concentration of the first doped silicon layer 305G' gradually increases from the lowest-level boron-doped silicon layer to the highest-level boron-doped silicon layer. According to an embodiment, the first doped silicon layer 305G' may be a multi-layer stack including a bottom layer, which is at the lowest level, an intermediate layer, which is at an intermediate level higher than the bottom layer, and a top layer, which is at the highest level higher than the intermediate layer. The boron concentration of the first doped silicon layer 305G' may include a gradient doping profile in which the boron concentration of the first doped silicon layer 12 gradually increases from the bottom to top layer. The ratio PB of boron concentration to the height HB of the bottom layer may be identical to or different from the ratio PM of boron concentration to the height HC of the intermediate layer and the ratio PT of boron concentration to the height HT of the top layer. For example, the ratio PB of boron concentration to the height HB of the bottom layer may be larger than the ratio PM of boron concentration to the height HC of the intermediate layer and the ratio PT of boron concentration to the height HT of the top layer. The ratio PM of boron concentration to the height HC of the intermediate layer may be smaller than the ratio PB of boron concentration to the height HB of the bottom layer and the ratio PT of boron concentration to the height HT of the top layer. The height HB of the bottom layer, the height HC of the intermediate layer, and the height HT of the top layer may be identical to or different from each other. For example, the height HB of the bottom layer may be smaller than the height HC of the intermediate layer and the height HT of the top layer. The height HC of the intermediate layer may be larger than the height HB of the bottom layer and the height HT of the top layer. It is noted that FIG. 2B is a simplified schematic example and the height HB of the bottom layer of the first doped silicon layer 305G', the height HC of the intermediate layer, and the height HT of the top layer are not limited to those shown in the drawings but may include various values. The ratio PB of boron concentration to the height HB of the bottom layer of the first doped silicon layer 305G', the ratio PM of boron concentration to the height HC of the intermediate layer, and the ratio PT of boron concentration to the height HT of the top layer are not limited to those shown therein but may include various values.

The first doped silicon layer 305G' may further include at least one additional dopant selected from among tungsten, carbon, nitrogen, or a combination thereof. Thus, the first doped silicon layer 305G' may be a silicon layer doped with tungsten and boron. The first doped silicon layer 305G' may be a silicon layer doped with carbon and boron, according to an embodiment. The first doped silicon layer 305G' may be a silicon layer doped with tungsten, carbon and boron, according to an embodiment.

The second doped silicon layer 305S' may be formed on the first doped silicon layer 305G'. The thickness 305SH of the second doped silicon layer 305S' may be larger than the thickness 305GH of the first doped silicon layer 305G'. The second doped silicon layer 305S' may include a single boron-doped silicon layer. The thickness 305SH of the single boron-doped silicon layer of the second doped silicon layer 305S' may be larger than the thickness 305GH of the multi-layer stack of boron-doped silicon layers of the first doped silicon layer 305G'. The second doped silicon layer 305S' may include a bottom surface 305SB and a top surface 305ST, and the bottom surface 305SB of the second doped silicon layer 305S' may denote the same surface as the top surface 305SB of the first doped silicon layer 305G'. The bottom surface 305SB of the second doped silicon layer 305S' may have the same boron concentration as the top surface 305ST.

The boron concentration of the second doped silicon layer 305S' may be larger than the boron concentration of the first doped silicon layer 305G'. The second doped silicon layer 305S' may have a non-graded concentration of boron. The second doped silicon layer 305S' may include a non-graded vertical concentration of boron. The boron concentration of the second doped silicon layer 305S' may have a profile in which the boron concentration of the second doped silicon layer 305S' is uniform from the bottom surface 305SB of the second doped silicon layer 305S' to the top surface 305ST. Referring to FIG. 2A, the ratio P2 of boron concentration to the vertical distance 305SH from the bottom surface 305SB of the second doped silicon layer 305S' may be constant. The boron concentration of the second doped silicon layer 305S' may be continuous from the boron concentration of the first doped silicon layer 305G'. Thus, the boron concentration at the bottom surface 305SB of the second doped silicon layer 305S' may be identical to the boron concentration at the highest level of the first doped silicon layer 305G'.

The second doped silicon layer 305S' may further include at least one additional dopant selected from among tungsten, carbon, nitrogen, or a combination thereof. Thus, the second doped silicon layer 305S' may be a silicon layer doped with tungsten and boron. The second doped silicon layer 305S' may be a silicon layer doped with carbon and boron, according to an embodiment. The second doped silicon layer 305S' may be a silicon layer doped with tungsten, carbon and boron, according to an embodiment.

An opening mask 306 may be formed on the second doped silicon layer 305S'. The opening mask 306 may include a photoresist pattern.

Figure 6B:
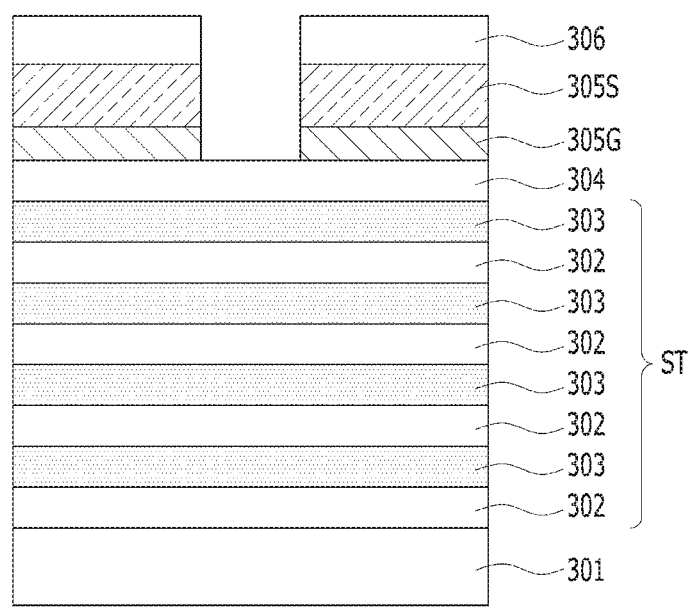

As illustrated in FIG. 6B, the opening mask 306 may be used as an etch mask to selectively remove the second doped silicon layer 305S' and the first doped silicon layer 305G'. Thus, the second doped silicon layer 305S' may become a second boron-doped silicon pattern 305S. The first doped silicon layer 305G' may become a first boron-doped silicon pattern 305G. Thus, a portion of the capping layer 304 may be exposed.

Figure 6C:
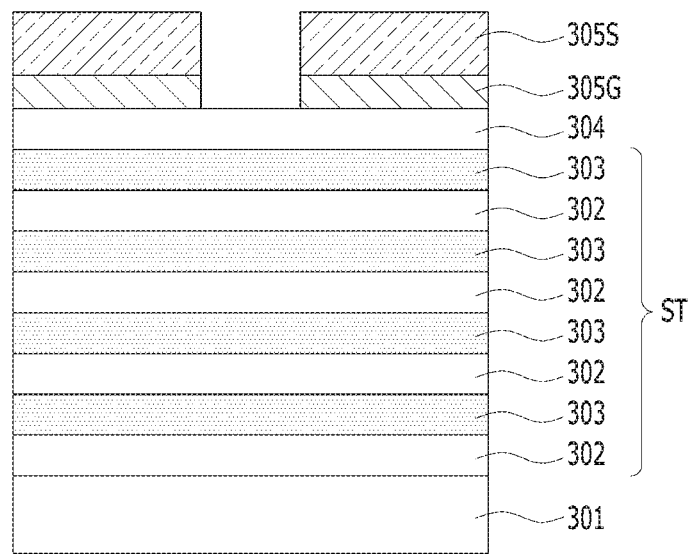

As illustrated in FIG. 6C, the opening mask 306 may be removed. While removing the opening mask 306, the second boron-doped silicon pattern 305S may be thinned. In other words, the thickness of the second boron-doped silicon pattern 305S after the opening mask 306 is removed may be smaller than the thickness of the second boron-doped silicon pattern 305S before the opening mask 306 is removed.

Figure 6D:
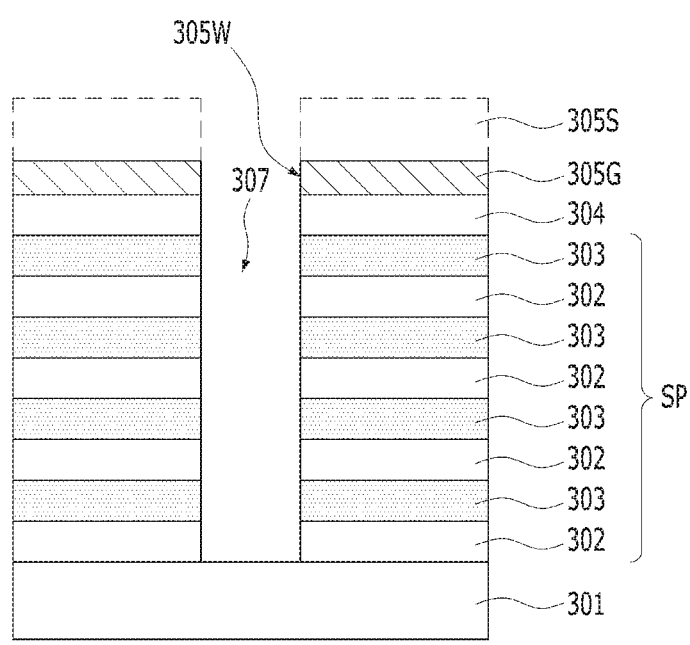

Referring to FIG. 6D, a stack hole 307 may be formed in the capping layer 304 and the alternate stack ST. The stack hole 307 may be formed by etching the capping layer 304 and the alternate stack ST using the second boron-doped silicon pattern 305S and the first boron-doped silicon pattern 305G as an etch mask. To form the stack hole 307, the capping layer 304 and the alternate stack ST may sequentially be etched using the second boron-doped silicon pattern 305S and the first boron-doped silicon pattern 305G as an etch mask. The etching process for forming the stack hole 307 may stop at the substrate 301. Thus, the top surface of the substrate 301 may be partially exposed. During the etching process, the second boron-doped silicon pattern 305S may be removed. The height of the first boron-doped silicon pattern 305G after the stack hole 307 is formed may be smaller than the height of the first boron-doped silicon pattern 305G before the stack hole 307 is formed.

By the above-described etching process, an alternate stack pattern SP including a plurality of stack holes 307 may be formed. Various stack holes 307 may be formed depending on the difficulty of etching process. For example, as the boron concentration of the first doped silicon layer 305G' reduces, stripping of the first doped silicon layer 305G' may be easier. Thus, a side wall 305W of the first boron-doped silicon pattern 305G may be vertically formed. As the side wall 305W of the first boron-doped silicon pattern 305G is vertically formed, a side wall of the stack hole 307 may be vertically formed. To form the stack hole 307, dry etching, wet etching, or a combination thereof may be used. The stack hole 307 may have a e high ratio high aspect ratio. The stack hole 307 may have an aspect ratio of, at least, 1:1 or more. For example, the stack hole 307 may have a high aspect ratio of 10:1 or more.

Figure 6E:
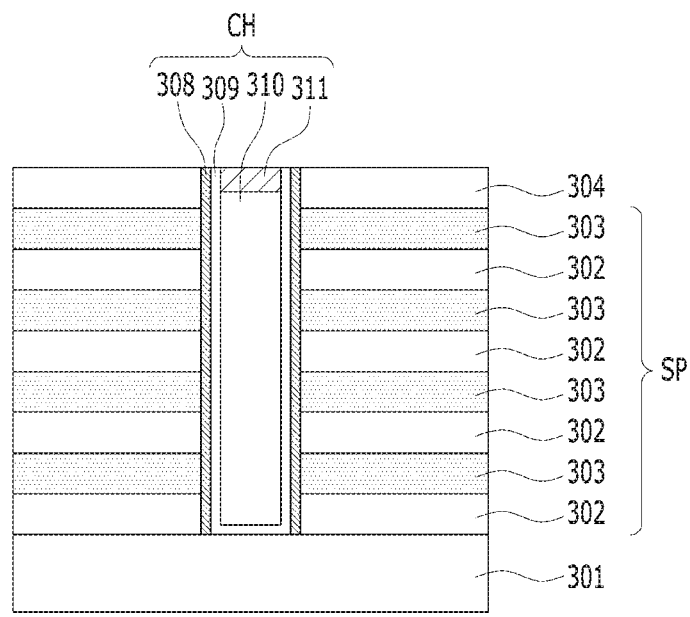

As illustrated in FIG. 6E, the first boron-doped silicon pattern 305G may be removed. Subsequently, a channel structure CH may be formed in the stack hole 307. The stack hole 307 may include a dielectric layer 308, a channel active layer 309, a channel core layer 310, and a channel pad layer 311. Thus, the dielectric layer 308, channel active layer 309, channel core layer 310, and channel pad layer 311 may be formed in the stack hole 307. The dielectric layer 308 may be formed in the stack hole 307. To form the dielectric layer 308, a dielectric layer may be formed inside the stack hole 307. The dielectric layer 308 may be formed conformally on the surface of the stack hole 307. The dielectric layer 308 may be conformally formed. The dielectric layer 308 may be formed only inside the stack hole 307. The dielectric layer 308 may have a multi-layer structure.

An etch-back processing may then be performed to remove the dielectric layer 308 from a bottom of the stack hole 307 to thereby expose the surface of the substrate 301. Therefore, the dielectric layer 308 may be formed conformally on the sidewall surface of the stack hole 307. The channel active layer 309 may be formed on the dielectric layer 308 and may directly contact the dielectric layer 308. To form the channel active layer 309, polysilicon or monocrystalline silicon may be formed in the stack hole 307. The channel active layer 309 may be conformally formed. The channel core layer 310 may be formed on the channel active layer 309 and may directly contact the channel active layer 309. To form the channel core layer 310, silicon oxide may be formed in the stack hole 307. The channel core layer 310 may fill the inside of the stack hole 307. To form the channel core layer 310, planarization may be performed. Thus, the top surface of the capping layer 304 may be exposed.

Subsequently, a top portion of the channel core layer 310 may be recessed. The channel pad layer 311 contacting the channel active layer 309 may be formed in the stack hole 307. The channel pad layer 311 may fill the recess of the channel core layer 310. The channel pad layer 311 may include polysilicon or monocrystalline silicon. A bottom surface of the channel pad layer 311 may be in direct contact with a top surface of the channel core layer 310 and a sidewall of the channel pad layer 311 may be in direct contact with an uppermost sidewall of the channel active layer 309.

Figure 6F:
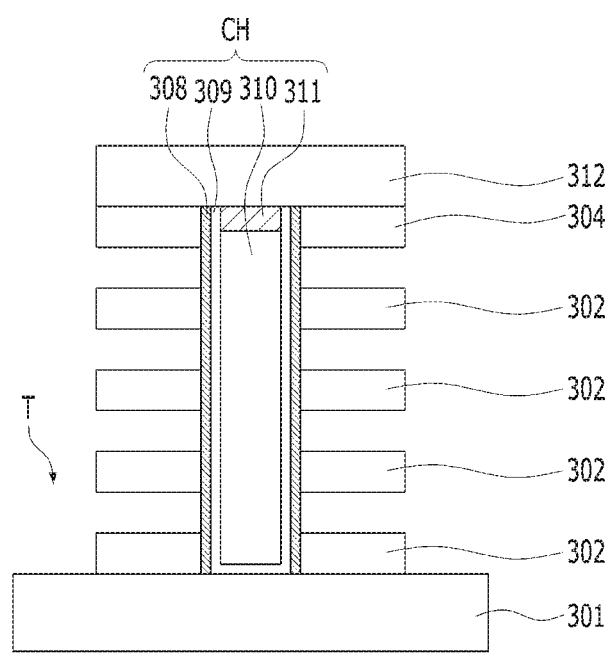

Referring to FIG. 6F, a channel capping layer 312 may be formed on the capping layer 304 and the channel structure CH. The channel capping layer 312 may directly contact the capping layer 304, the dielectric layer 308, the channel active layer 309 and the channel pad layer 311. The channel capping layer 312 may be or include silicon oxide.

Subsequently, as shown in FIG. 6F, the alternate stack pattern SP, capping layer 304, and channel capping layer 312 may be etched, forming a trench T. The trench T may contact the substrate 301. The sacrificial layers 303 may be removed through the trench T.

Figure 6G:
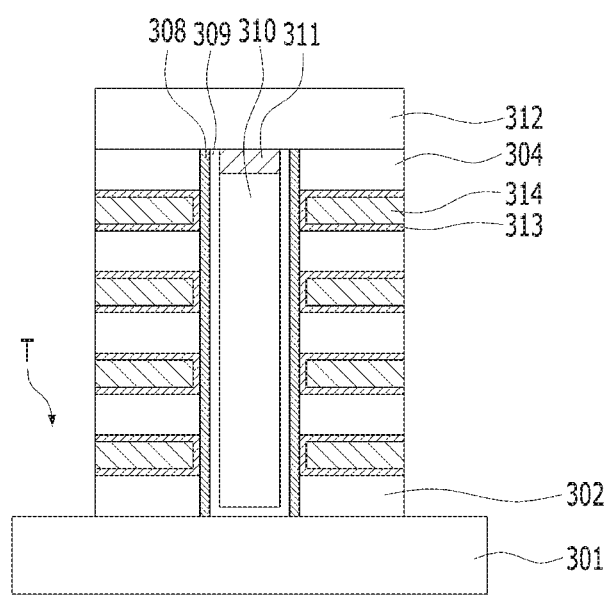

Referring to FIG. 6G, a memory film 313 may be formed in the space resultant from removing the sacrificial layers 303. The memory film 313 may be conformally formed. The memory film 313 may include a plurality of films. For example, the memory film 313 may be formed by sequentially depositing a tunnel insulation film, a charge trap film, and a charge block film. The tunnel insulation film may be provided for charge tunneling and be formed of an oxide film. The charge trap film may be provided for trapping electric charges and hence storing data and be formed of a nitride film. The charge block film may be provided for blocking movement of electric charges in the charge trap film to the outside and be formed of an oxide film. In other words, the memory film 313 may have a triple-layer structure of oxide-nitride-oxide (ONO). A gate electrode 314 may be formed on the memory film 313, filling the space resultant from removing the sacrificial layers 303. The gate electrode 314 may include a metal or metal oxide which may be conformally deposited by CVD or ALD. The gate electrode 314 may include tungsten (W). To form the memory film 313 and the gate electrode 314, the memory film 313 and gate electrode 314 exposed in the trench T may be removed. In the instant embodiment, the memory 313 is positioned between the channel structure CH and the gate electrode 314 and between the insulation layer 302 and the gate electrode 314. However, embodiments of the disclosure are not limited thereto. For example, an insulation film other than the memory film 313 may be positioned between the insulation layer 302 and the gate electrode 314. For example, a single oxide or nitride film may be positioned between the insulation layer 302 and the gate electrode 314. In the instant embodiment, the second doped silicon layer 305S' may be evenly doped with a high-concentration of boron, increasing the etch selectivity for the alternate stack ST. Further, since the boron concentration gradually increases as the distance from the bottom surface 305GB of the first doped silicon layer 305G' increases, hard mask stripping may be easily performed. In other words, a high-etch selectivity, easy-to-strip hard mask layer may be formed by forming the second doped silicon layer 305S' and the first doped silicon layer 305G'. Thus, the etch profile of the alternate stack ST may be vertically formed. As the etch file is vertically formed, the processing stability and reliability may be secured for memory devices.

It is apparent to one of ordinary skill in the art that the various embodiments of the present invention as described above are not limited to the above-described embodiments and those shown in the drawings, and various changes, modifications, or alterations may be made thereto without departing from the scope of the present invention.

What is claimed is:

1. A method for fabricating a semiconductor device, the method comprising:
    forming an etching target layer;
    forming a hard mask layer on the etching target layer, the hard mask layer including a first boron-doped silicon layer and a second boron-doped silicon layer on the first boron-doped silicon layer; and
    etching the etching target layer using the hard mask layer as an etching barrier,
    wherein the second boron-doped silicon layer has a larger boron concentration than the first boron-doped silicon layer,
    wherein the first boron-doped silicon layer has a first boron concentration which is graded vertical concentration, and the second boron-doped silicon layer has a second boron concentration which is non-graded vertical concentration.

2. The method of claim 1,
    wherein the first boron-doped silicon layer and the second boron-doped silicon layer each are formed by doping a polysilicon layer with boron.

3. The method of claim 2,
    wherein the first boron concentration of the first boron-doped silicon layer is lowest at a bottom surface of the polysilicon layer and has a gradient doping profile in which the boron concentration of the first boron-doped silicon layer gradually increases from the bottom surface of the polysilicon layer to a top surface of the polysilicon layer.

4. The method of claim 2,
    wherein the second boron concentration of the second boron-doped silicon layer has a profile in which the boron concentration of the second boron-doped silicon layer is uniform from the bottom surface of the polysilicon layer to a top surface of the polysilicon layer.

5. The method of claim 1,
    wherein the first boron-doped silicon layer is thinner than the second boron-doped silicon layer.

6. The method of claim 1,
    wherein the first boron-doped silicon layer includes a low-concentration boron-doped silicon layer, and wherein the second boron-doped silicon layer includes a high-concentration boron-doped silicon layer.

7. The method of claim 1,
    wherein the first boron-doped silicon layer includes a multi-layer stack of boron-doped silicon layers.

8. The method of claim 1,
    wherein the first boron-doped silicon layer includes a multi-layer stack of boron-doped silicon layers,
    wherein the second boron-doped silicon layer includes a single boron-doped silicon layer, and
    wherein the single boron-doped silicon layer is thicker than the multi-layer stack of boron-doped silicon layers.

9. The method of claim 1,
    wherein at least one of the first boron-doped silicon layer and the second boron-doped silicon layer further includes an additional dopant.

10. The method of claim 9,
    wherein the additional dopant includes tungsten, carbon, nitrogen, or a combination thereof.

11. The method of claim 1,
    wherein the first boron-doped silicon layer and the second boron-doped silicon layer include a silicon layer doped with tungsten and boron, a silicon layer doped with carbon and boron, or a silicon layer doped with tungsten, carbon, and boron.

12. The method of claim 1,
    wherein the first boron-doped silicon layer and the second boron-doped silicon layer are formed in a plasma enhanced chemical vapor deposition (PECVD) scheme using a $SiH_4$ gas and a $B_2H_6$ gas.

13. The method of claim 1,
    wherein the first boron-doped silicon layer has the first boron concentration at which stripping proceeds more rapidly than the second boron-doped silicon layer,
    wherein the second boron-doped silicon layer has the second boron concentration at which an etch selectivity for the etching target layer is rendered larger than the first boron-doped silicon layer, and
    wherein the second boron concentration is larger than the first boron concentration.

14. The method of claim 1,
    wherein the etching target layer includes a silicon oxide.

15. The method of claim 1,
    wherein the etching target layer includes a stack of a plurality of silicon oxide layers and a plurality of silicon nitride layers alternately stacked.

* * * * *